(12) United States Patent
Cao et al.

(10) Patent No.: US 12,387,793 B2
(45) Date of Patent: Aug. 12, 2025

(54) ENABLING SIGNIFICANT SCALING OF WORDLINE SWITCH WITH WORDLINE DEPENDENT NEGATIVE BITLINE VOLTAGE

(71) Applicant: Western Digital Technologies, Inc., San Jose, CA (US)

(72) Inventors: Wei Cao, Fremont, CA (US); Weiyi Li, Fremont, CA (US); Dengtao Zhao, Los Gatos, CA (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 218 days.

(21) Appl. No.: 18/230,078

(22) Filed: Aug. 3, 2023

(65) Prior Publication Data
US 2024/0395330 A1    Nov. 28, 2024

Related U.S. Application Data

(60) Provisional application No. 63/468,846, filed on May 25, 2023.

(51) Int. Cl.
| G11C 11/56 | (2006.01) |
| G11C 16/08 | (2006.01) |
| G11C 16/10 | (2006.01) |
| G11C 16/24 | (2006.01) |
| G11C 16/30 | (2006.01) |

(52) U.S. Cl.
CPC ............ *G11C 16/102* (2013.01); *G11C 16/08* (2013.01); *G11C 16/24* (2013.01); *G11C 16/30* (2013.01)

(58) Field of Classification Search
CPC ....... G11C 16/102; G11C 16/08; G11C 16/24; G11C 16/30; G11C 11/5628; G11C 16/0483; G11C 16/10; G11C 16/3427
See application file for complete search history.

(56) References Cited

U.S. PATENT DOCUMENTS

| 2009/0323432 | A1* | 12/2009 | Futatsuyama | G11C 16/3454 365/185.25 |
| 2010/0232227 | A1* | 9/2010 | Lee | G11C 16/3454 365/185.23 |
| 2013/0223156 | A1* | 8/2013 | Lee | G11C 11/5628 365/185.27 |
| 2013/0242661 | A1* | 9/2013 | Lei | G11C 11/5642 365/185.17 |
| 2022/0208287 | A1* | 6/2022 | Petkar | G11C 16/3459 |

* cited by examiner

*Primary Examiner* — Hien N Nguyen
(74) *Attorney, Agent, or Firm* — Dickinson Wright PLLC

(57) ABSTRACT

A memory device is provided and includes a memory block that has a plurality of memory cells that are arranged in a plurality of word lines. The memory device also includes a plurality of word line switch transistors that are electrically coupled with the plurality of word lines, where the plurality of word lines are grouped into a plurality of zones based on a size of a word line switch transistor associated with each word line of the plurality of word lines. The memory device also includes a bitline biasing circuit for providing a negative biasing voltage to a bitline corresponding to a memory cell of the selected word line during programming of the selected word line and the bitline biasing circuit is configured to set a magnitude of the negative biasing voltage based on which zone of the plurality of zones the selected word line is in.

20 Claims, 21 Drawing Sheets

| WLs | | ZONE | VPGMMAX | VPGMWIDE |
|---|---|---|---|---|
| UMH | 200 - 279 | 9 | V1 | VPGMWIDE_1 |
| | 178 - 199 | 8 | V3 | VPGMWIDE_3 |
| | 170 - 177 | 7 | V4 | VPGMWIDE_4 |
| MMH | 81 - 169 | 6 | V1 | VPGMWIDE_1 |
| | 60 - 80 | 5 | V3 | VPGMWIDE_3 |
| | 52 - 59 | 4 | V4 | VPGMWIDE_4 |
| LMH | 42 - 51 | 3 | V2 | VPGMWIDE_2 |
| | 15 - 41 | 2 | V3 | VPGMWIDE_3 |
| | 0 - 14 | 1 | V4 | VPGMWIDE_4 |

2200

2202 — PROGRAM A SELECTED WORD LINE OF A PLURALITY OF WORD LINES TO RESPECTIVE INTENDED DATA STATES IN A PLURALITY OF PROGRAM LOOPS

2204 — BIAS A BITLINE CORRESPONDING TO A MEMORY CELL OF THE SELECTED WORD LINE DURING PROGRAMMING OF THE SELECTED WORD LINE COMPRISING PROVIDING A NEGATIVE BIASING VOLTAGE TO THE BITLINE AND SETTING A MAGNITUDE OF THE NEGATIVE BIASING VOLTAGE BASED ON A ZONE OF A PLURALITY OF ZONES THE SELECTED WORD LINES IS IN, WHEREIN THE PLURALITY OF WORD LINES ARE GROUPED INTO THE PLURALITY OF ZONES BASED ON A SIZE OF A WORD LINE SWITCH TRANSISTOR ASSOCIATED WITH EACH WORD LINE OF THE PLURALITY OF WORD LINES

*FIG. 22*

ENABLING SIGNIFICANT SCALING OF WORDLINE SWITCH WITH WORDLINE DEPENDENT NEGATIVE BITLINE VOLTAGE

CROSS-REFERENCE TO RELATED APPLICATIONS

This application claims the benefit of U.S. Provisional Application No. 63/468,846, filed on May 25, 2023. The entire disclosure of the application referenced above is incorporated herein by reference.

BACKGROUND

1. Field

The present disclosure is related generally to a word line switch design in a memory device.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND memory devices include a chip with a plurality of memory blocks, each of which includes an array of memory cells arranged in a plurality of word lines. Programming the memory cells of a word line to retain data typically occurs in a plurality of program loops, each of which includes the application of a programming pulse to a control gate of the word line and, optionally, a verify operation to sense the threshold voltages of the memory cells being programmed. Each program loop may also include a pre-charge operation prior to the programming pulse to pre-charge a plurality of channels containing memory cells to be programmed.

SUMMARY

This section provides a general summary of the present disclosure and is not a comprehensive disclosure of its full scope or all of its features and advantages.

An object of the present disclosure is to provide a memory apparatus and a method of operation of the memory apparatus that address and overcome shortcomings described herein.

Accordingly, it is an aspect of the present disclosure to provide a memory device. The memory device comprises: a memory block that includes a plurality of memory cells that are arranged in a plurality of word lines; and a plurality of word line switch transistors that are electrically coupled with the plurality of word lines, where the plurality of word lines are grouped into a plurality of zones based on a size of a word line switch transistor associated with each word line of the plurality of word lines. The memory device also comprises programming circuitry being configured to program a selected word line of the plurality of word lines to respective intended data states in a plurality of program loops and a bitline biasing circuit for biasing a bitline corresponding to a memory cell of the selected word line during programming of the selected word line. The bitline biasing circuit operates to provide a negative biasing voltage to the bitline, where the bitline biasing circuit is configured to set a magnitude of the negative biasing voltage based on which zone of the plurality of zones the selected word line is in.

Accordingly, it is an aspect of the present disclosure to provide a method of operating a memory device. The method comprising the steps of programming a selected word line of a plurality of word lines to respective intended data states in a plurality of program loops and biasing a bitline corresponding to a memory cell of the selected word line during programming of the selected word line, where biasing the bitline comprises providing a negative biasing voltage to the bitline and setting a magnitude of the negative biasing voltage based on a zone of a plurality of zones the selected word line is in. The plurality of word lines are grouped into the plurality of zones based on a size of a word line switch transistor associated with each word line of the plurality of word lines.

Accordingly, it is an aspect of the present disclosure to provide an apparatus. The apparatus comprises: a means for programming a selected word line of a plurality of word lines to respective intended data states in a plurality of program loops; a means for providing a negative biasing voltage to a bitline corresponding to a memory cell of the selected word line during programming of the selected word line; and a means for setting a magnitude of the negative biasing voltage based on a zone of a plurality of zones the selected word line is in, wherein the plurality of word lines are grouped into the plurality of zones based on a size of a word line switch transistor associated with each word line of the plurality of word lines

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 22 a flow chart is provided that depicts the steps of programming a selected word line WLn according to another embodiment of the present disclosure.

DESCRIPTION OF THE ENABLING EMBODIMENTS

Figure 1:
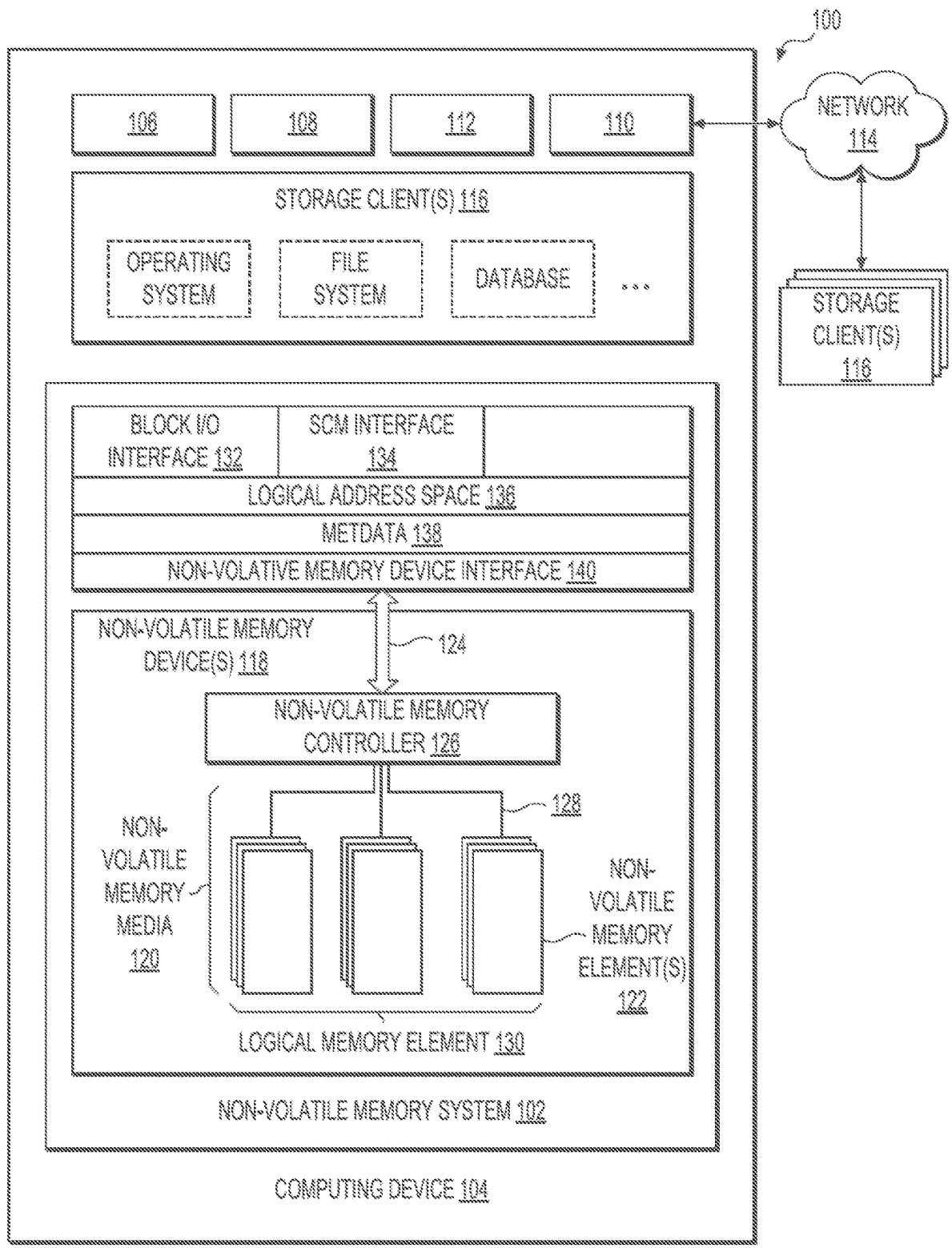
FIG. 1 is a schematic block diagram illustrating a system according to aspects of the disclosure.

As discussed in further detail below, the present disclosure is related generally to a memory device which includes a unique word line switch area that includes a plurality of word line switches that have different widths and also is related to techniques for programming a selected word line using the word line switches of different widths.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side select gate SG transistors (SGD transistors), on a drain-side of the NAND string which is connected to a bit line, and one or more source-side select gate SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines that are connected to the memory cells. The memory cells can include data memory cells, which are eligible to store user data, and dummy or non-data memory cells, which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge-trapping layer.

Each memory cell may be associated with a data state according to write data in a program command. Based on its data state, a memory cell will either remain in the erased state or be programmed to a programmed data state that is associated with a predetermined range of threshold voltages Vt. For example, in a one bit per cell storage scheme, there are two data states including the erased state and one programmed state, and in a three bit per cell storage scheme, there are eight data states including the erased state and seven programmed states.

During a program operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming pulses until the programming is completed. Next, a second word line, WL1, is programmed using one or more programming pulses until the programming is completed, and so forth. A programming pulse may include a set of increasing program voltages VPGM which are applied to the word line in respective program loops or program-verify iterations. Verify operations or stages may be performed after each program voltage to determine whether the memory cells have completed programming to their respective intended data states. When programming is completed for a memory cell, it can be inhibited from further programming while programming continues for other memory cells in subsequent program loops.

A memory device may have word line switches transistors (hereinafter referred to as "WLSWs" or "WLSW" in the singular) coupled to one or more word lines (WLs) from memory blocks of memory cells. As the quantity of word lines in a memory block increases, the quantity of WLSWs associated with that memory block. Thus, a width of a WLSW switch area in a complementary metal-oxide (CMOS) layer of the chip increases as a result.

FIG. 1 is a block diagram of one embodiment of a system 100 comprising non-volatile memory device(s) 118 configured in accordance with an embodiment of the claimed solution. A computing device 104 may comprise non-volatile memory system 102, a processor 106, volatile memory 108, and a communication interface 110. The processor 106 may comprise one or more central processing units, one or more general-purpose processors, one or more application-specific processors, one or more virtual processors (e.g., the computing device 104 may be a virtual machine operating within a host), one or more processor cores, or the like. The communication interface 110 may comprise one or more network interfaces configured to communicatively couple the computing device 104 and/or non-volatile memory controller 126 to a communication network 114, such as an Internet Protocol (IP) network, a Storage Area Network (SAN), wireless network, wired network, or the like.

The non-volatile memory device(s) 118, in various embodiments, may be disposed in one or more different locations relative to the computing device 104. In one embodiment, the non-volatile memory device(s) 118 comprises one or more non-volatile memory element(s) 122, such as semiconductor chips, memory die, or packages or other integrated circuit devices disposed on one or more printed circuit boards, storage housings, and/or other mechanical and/or electrical support structures. For example, the non-volatile memory device(s) 118 may comprise one or more direct inline memory module (DIMN) cards, one or more expansion cards and/or daughter cards, a solid-state-drive (SSD) or other hard drive device, and/or may have another memory and/or storage form factor known to those of skill in the art. The non-volatile memory device(s) 118 may be integrated with, and/or mounted on, a motherboard of the computing device 104, installed in a port and/or slot of the computing device 104, installed on a different computing device 104 and/or a dedicated storage appliance on the network 114, in communication with the computing device 104 over an external bus (e.g., an external hard drive), or the like.

The non-volatile memory device(s) 118, in one embodiment, may be disposed on a memory bus of a processor 106 (e.g., on the same memory bus as the volatile memory 108, on a different memory bus from the volatile memory 108, in place of the volatile memory 108, or the like). In a further embodiment, the non-volatile memory device(s) 118 may be disposed on a peripheral bus of the computing device 104, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device(s) 118 may be disposed on a data network 114, such as an Ethernet network, an Infiniband network, SCSI RDMA over a network 114, a storage area network (SAN), a local area network (LAN), a wide area network (WAN) such as the Internet, another wired and/or wireless network 114, or the like.

The computing device 104 may further comprise a non-transitory, computer readable storage medium 112. The computer readable storage medium 112 may comprise executable instructions configured to cause the computing device 104 (e.g., processor 111) to perform steps of one or more of the methods disclosed herein.

According to various embodiments, a non-volatile memory controller 126 may manage one or more non-volatile memory device(s) 118 and/or non-volatile memory element(s) 122. The non-volatile memory device(s) 118 may comprise recording, memory, and/or storage devices, such as solid-state storage device(s) and/or semiconductor storage device(s) that are arranged and/or partitioned into a plurality of addressable storage locations. As used herein, a storage location refers to any physical unit of memory (e.g., any quantity of physical storage media on a non-volatile memory device(s) 118). Memory units may include, but are not limited to: pages, memory divisifons, blocks, data blocks, memory blocks, sectors, collections or sets of physical storage locations (e.g., logical pages, logical blocks, logical memory blocks), or the like.

A device driver and/or the non-volatile memory controller 126, in certain embodiments, may present a logical address space 136 to the storage client(s) 116. As used herein, a logical address space 136 refers to a logical representation of memory resources. The logical address space 136 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device(s) 118 may maintain metadata 138, such as a logical to physical address mapping structure, to map logical addresses of the logical address space 136 to storage location on the non-volatile memory device(s) 118. A device driver may be configured to provide storage services to one or more storage client(s) 116. The storage client(s) 116 may include local storage client(s) 116 operating on the computing device 104 and/or remote, storage client(s) 116 accessible via the network 114 and/or communication interface 110. The storage client(s) 116 may include, but are not limited to: operating systems, file systems, database applications, server applications, kernel-level processes, user-level processes, applications, and the like.

A device driver may be communicatively coupled to one or more non-volatile memory device(s) 118. The one or more non-volatile memory device(s) 118 may include different types of non-volatile memory devices including, but not limited to: solid-state storage devices, semiconductor storage devices, SAN storage resources, or the like. The one or more non-volatile memory device(s) 118 may comprise one or more of a respective non-volatile memory controller 126 and/or non-volatile memory media 120. A device driver may provide access to the one or more non-volatile memory device(s) 118 via a traditional block I/O interface 132. Additionally, a device driver may provide access to other functionality through the storage class memory interface (SCM interface 134). The metadata 138 may be used to manage and/or track data operations performed through any of the block I/O interface 132, SCM interface 134, or other, related interfaces.

In one embodiment, a user application such as software application operating on or in conjunction with the storage client(s) 116 uses the non-volatile memory system 102. The storage client(s) 116 manage files and data and utilizes the functions and features of the non-volatile memory controller 126 and associated non-volatile memory media 120. Representative examples of storage clients include, but are not limited to, a server, a file system, an operating system, a database management system ("DBMS"), a volume manager, and the like. In one embodiment, the storage client(s) 116 access to the one or more non-volatile memory device(s) 118 via a traditional block I/O interface 132.

Certain conventional block storage devices divide the storage media into volumes or partitions. Each volume or partition may include a plurality of sectors. One or more sectors are organized into a block (also referred to as a data block). In certain storage systems, such as those interfacing with the Windows® operating systems, the data blocks are referred to as clusters. In other storage systems, such as those interfacing with UNIX, Linux, or similar operating systems, the data blocks are referred to simply as blocks. A block or cluster represents a smallest physical amount of storage space on the storage media that is managed by the non-volatile memory controller 126. A block storage device may associate n blocks available for user data storage across the non-volatile memory media 120 with a logical block address, numbered from 0 to n. In certain block storage devices, the logical block addresses may range from 0 to n per volume or partition. In conventional block storage devices, a logical block address maps directly to a particular logical block.

A device driver may present a logical address space 136 to the storage client(s) 116 through one or more interfaces. As discussed above, the logical address space 136 may comprise a plurality of logical addresses, each corresponding to respective storage locations within the one or more non-volatile memory device(s) 118. A device driver may maintain metadata 138 comprising any-to-any mappings between logical addresses and storage locations, or the like.

A device driver may further comprise and/or be in communication with a non-volatile memory device interface 140 configured to transfer data, commands, and/or queries to the one or more non-volatile memory device(s) 118 over a bus 124, which may include, but is not limited to: a memory bus of a processor 106, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 114, Infiniband, SCSI RDMA, non-volatile memory express (NVMe), or the like. The non-volatile memory device interface 140 may communicate with the one or more non-volatile memory device(s) 118 using input-output control (IO-CTL) command(s), IO-CTL command extension(s), remote direct memory access, or the like.

The communication interface 110 may comprise one or more network interfaces configured to communicatively couple the computing device 104 and/or the non-volatile memory controller 126 to a network 114 and/or to one or more remote, network-accessible storage client(s) 116. The storage client(s) 116 may include local storage client(s) 116 operating on the computing device 104 and/or remote, storage client(s) 116 accessible via the network 114 and/or the communication interface 110. The non-volatile memory controller 126 is part of and/or in communication with one or more non-volatile memory device(s) 118. Although FIG. 1 depicts a single non-volatile memory device(s) 118, the disclosure is not limited in this regard and could be adapted to incorporate any number of non-volatile memory device(s) 118.

The non-volatile memory device(s) 118 may comprise one or more non-volatile memory element(s) 122 of non-volatile memory media 120, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more non-volatile memory element(s) 122 of non-volatile memory media 120, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory element(s) 122 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 120 is referred to herein as "memory media," in various embodiments, the non-volatile memory media 120 may more generally comprise one or more non-volatile recording media capable of recording data, which may be referred to as a non-volatile memory medium, a non-volatile storage medium, or the like. Further, the non-volatile memory device(s) 118, in various embodiments, may comprise a non-volatile recording device, a non-volatile memory device, a non-volatile storage device, or the like.

The non-volatile memory media 120 may comprise one or more non-volatile memory element(s) 122, which may include, but are not limited to: chips, packages, planes, die, or the like. A non-volatile memory controller 126 may be configured to manage data operations on the non-volatile memory media 120, and may comprise one or more processors, programmable processors (e.g., FPGAs), ASICs, micro-controllers, or the like. In some embodiments, the non-volatile memory controller 126 is configured to store data on and/or read data from the non-volatile memory media 120, to transfer data to/from the non-volatile memory device(s) 118, and so on.

The non-volatile memory controller 126 may be communicatively coupled to the non-volatile memory media 120 by way of a bus 128. The bus 128 may comprise a bus for communicating data to/from the non-volatile memory element(s) 122. The bus 128, in one embodiment, may further comprise a control bus for communicating addressing and other command and control information to the non-volatile memory element(s) 122. In some embodiments, the bus 128 may communicatively couple the non-volatile memory element(s) 122 to the non-volatile memory controller 126 in parallel. This parallel access may allow the non-volatile memory element(s) 122 to be managed as a group, forming a logical memory element 130. The logical memory element 130 may be partitioned into respective logical memory units (e.g., logical pages) and/or logical memory divisions (e.g., logical data blocks, logical blocks, logical memory blocks). The logical memory units may be formed by logically combining physical memory units of each of the non-volatile memory element(s) 122.

In some embodiments, the non-volatile memory controller 126 may be configured to store data on one or more asymmetric, write-once media, such as non-volatile memory media 120. As used herein, a "write once" storage medium refers to a storage medium that is reinitialized (e.g., erased) each time new data is written or programmed thereon. As used herein, an "asymmetric" storage medium refers to a storage medium having different latencies for different storage operations. Many types of non-volatile memory media 120 are asymmetric; for example, a read operation may be much faster than a write/program operation, and a write/program operation may be much faster than an erase operation (e.g., reading the media may be hundreds of times faster than erasing, and tens of times faster than programming the media).

The non-volatile memory media 120 may be partitioned into memory divisions that can be erased as a group (e.g., memory blocks) in order to, inter alia, account for the asymmetric properties of the media. As such, modifying a single data sector or data block in-place may require erasing the entire memory block comprising the data, and rewriting the modified data to the memory block, along with the original, unchanged data. This may result in inefficient "write amplification," which may excessively wear the non-volatile memory media 120.

Therefore, in some embodiments, the non-volatile memory controller 126 may be configured to write data out-of-place. As used herein, writing data "out-of-place" refers to writing data to different physical storage location(s) rather than overwriting the data "in-place" (e.g., overwriting the data in the original physical location). Modifying data out-of-place may avoid write amplification, since existing, valid data on the memory block with the data to be modified need not be erased and rewritten. Moreover, writing data out-of-place may remove erasure from the latency impact of certain storage operations.

The non-volatile memory controller 126 may be organized according to a plurality of memory blocks of word lines within a non-volatile memory element(s) 122, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a memory block within a non-volatile memory element(s) 122 may be physically arranged in a monotonically increasing sequence of word line addresses, with consecutively addressed word lines also being physically adjacent (e.g., WL0, WL1, WL2, . . . WLN).

The non-volatile memory controller 126 may comprise and/or be in communication with a device driver executing on the computing device 104. A device driver may provide storage services to the storage client(s) 116 via one or more interfaces (block I/O interface 132, SCM interface 134, and/or others). In some embodiments, a device driver provides a computing device 104 block I/O interface 132 through which storage client(s) 116 perform block-level I/O operations. Alternatively, or in addition, a device driver may provide an SCM interface 134, which may provide other storage services to the storage client(s) 116. In some embodiments, the SCM interface 134 may comprise extensions to the block I/O interface 132 (e.g., storage client(s) 116 may access the SCM interface 134 through extensions or additions to the block I/O interface 132). Alternatively, or in addition, the SCM interface 134 may be provided as a separate API, service, and/or library.

A device driver may further comprise a non-volatile memory device interface 140 that is configured to transfer data, commands, and/or queries to the non-volatile memory controller 126 over a bus 124, as described above.

Figure 2A:
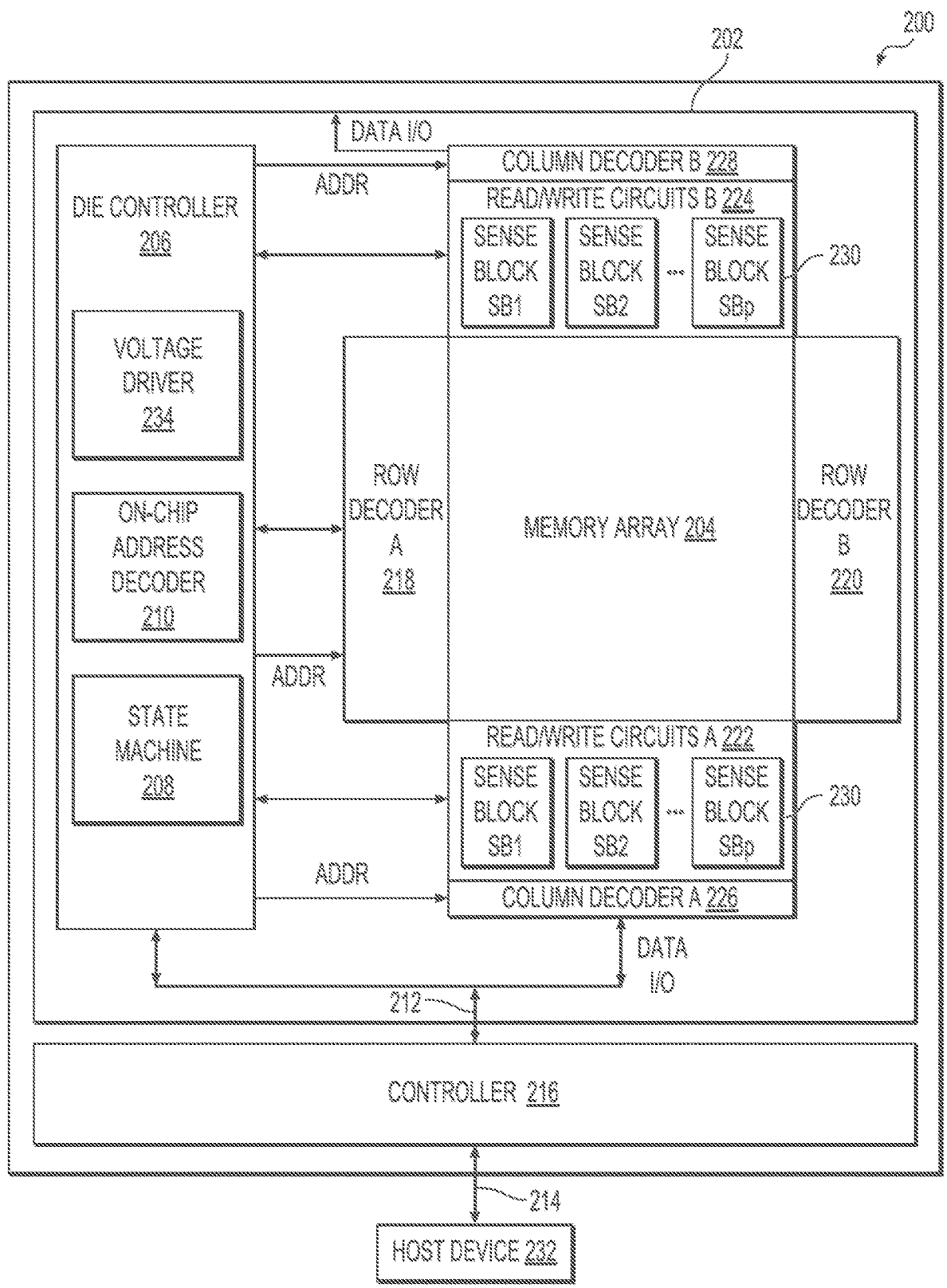
FIG. 2A is a schematic block diagram illustrating another system according to aspects of the disclosure.

FIG. 2A illustrates an embodiment of a non-volatile storage system 200 that may include one or more memory die(s) 202 or chips. Memory die(s) 202, in some embodiments, include a memory array 204 (two-dimensional or three dimensional) of memory cells, die controller 206, read/write circuits A 222, and read/write circuits B 224. In one embodiment, access to the memory array 204 by the various peripheral circuits is implemented in a symmetric fashion, on opposite sides of the array, so that the densities of access lines and circuitry on each side are reduced by half. The read/write circuits A 222 and read/write circuits B 224, in a further embodiment, include multiple sense amplifiers 230 which allow a page of memory cells to be read or programmed in parallel.

The memory array 204, in various embodiments, is addressable by word lines via row decoder A 218 and row decoder B 220 and by bit lines via column decoder A 226 and column decoder B 228. In some embodiments, a controller 216 is included in the same memory system 200 (e.g., a removable storage card or package) as the one or more memory die(s) 202. Commands and data are transferred between the host device 232 and controller 216 via lines 214 and between the controller and the one or more memory die(s) 202 via lines 212. One implementation can include multiple memory die(s) 202.

Die controller 206, in one embodiment, cooperates with the read/write circuits A 222 and read/write circuits B 224 to perform storage/memory operations on the memory array 204. The die controller 206, in certain embodiments, includes a voltage driver 234, a state machine 208, and an on-chip address decoder 210. In one embodiment, the state machine 208 comprises at least a portion of the voltage driver 234. In another embodiment, the controller 216 comprises at least a portion of the voltage driver 234.

The voltage driver 234, in one embodiment, is configured to supply a voltage to one or more components of the memory array. The magnitude of the voltage and whether the voltage level supplied is increasing or decreasing depends on the operation that the die controller 206 is implementing. At one point during an operation, the voltage level provided by the voltage driver 234 may comprise an analog signal increasing from ground or zero voltage, or a level substantially close to zero, to a desired voltage level required by components coupled to the voltage driver 234 to implement the desired operation. As the voltage applied to a component coupled to the voltage driver 234 increases, the period of time during which the voltage level is changing is referred to herein as charging, pre-charging, or ramping up.

At another point during an operation, the voltage level provided by the voltage driver 234 may comprise an analog signal configured to maintain a voltage level required by components coupled to the voltage driver 234 for a particular stage of implementing a desired operation. As the voltage applied to a component coupled to the voltage driver 234 remains substantially at the desired voltage level, the period of time is referred to herein as a steady state or stable.

At another point during an operation, the voltage level provided by the voltage driver 234 may comprise an analog signal decreasing from a desired voltage level to a lower voltage level, a ground level, or zero voltage, or a level substantially close to zero, for a desired operation. As the voltage applied to a component coupled to the voltage driver 234 decreases the period during which the voltage level is changing is referred to herein as discharging, post-charging, or ramping down.

The state machine 208, in one embodiment, provides chip-level control of storage and/or memory operations. The on-chip address decoder 210 provides an address interface to convert between the address that is used by the host or a memory controller to the hardware address used by the row decoder A 218, row decoder B 220, column decoder A 226 a, and column decoder B 228. The state machine 208 includes logic for activating and controlling the voltage driver 234 and other logic coupled to circuits in electrical communication with the voltage driver 234.

In one embodiment, one or any combination of die controller 206, voltage driver 234, on-chip address decoder 210, state machine 208, row decoder A 218, row decoder B 220, column decoder A 226, column decoder B 228, read/write circuits A 222, read/write circuits B 224, and/or controller 216 can be referred to as one or more managing circuits.

Figure 2B:
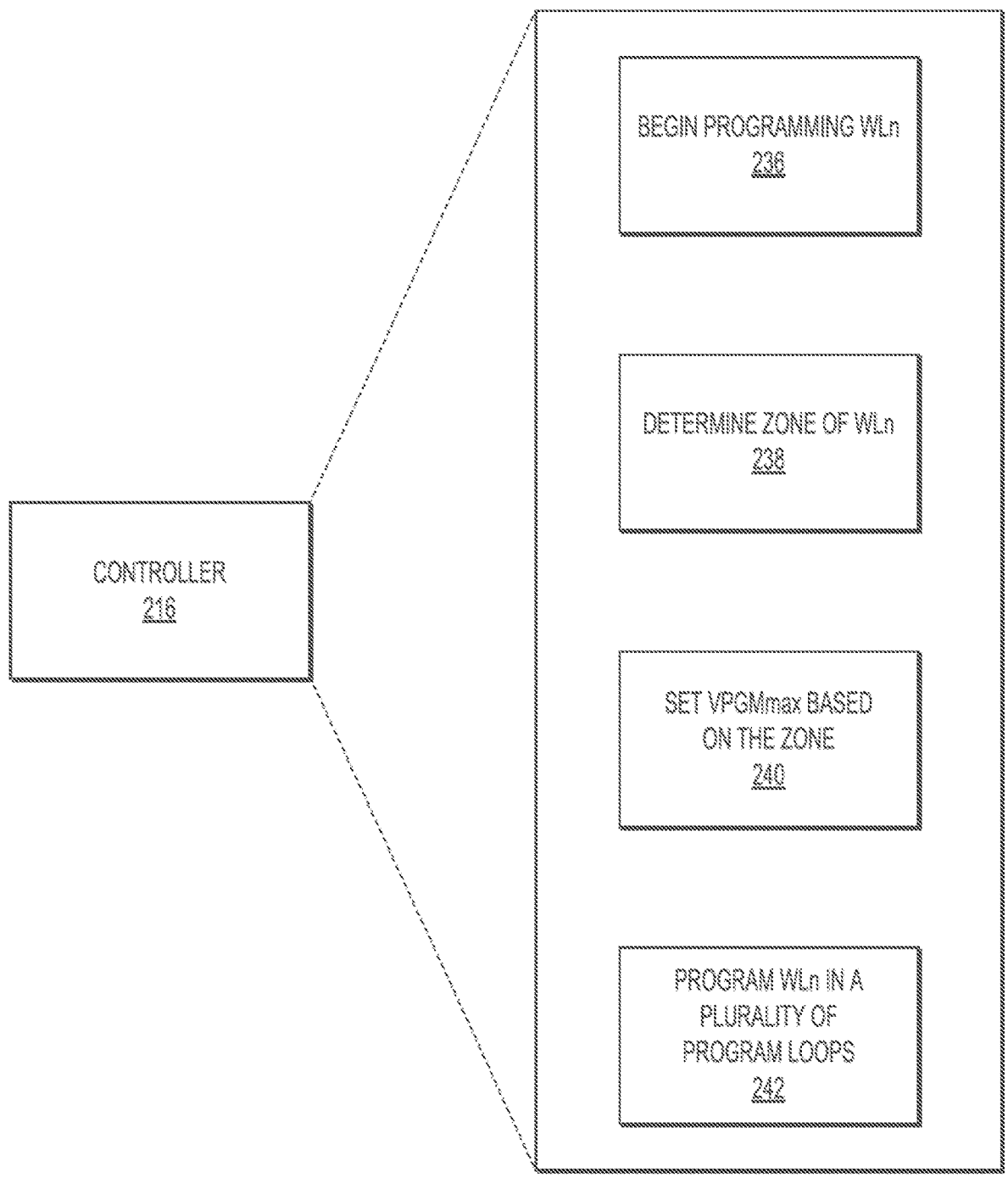
FIG. 2B is a schematic block diagram of a controller of the system of FIG. 2A.

Generally, control code can be included to perform the functions described herein including the steps of the flowcharts discussed further below. For example, as illustrated in FIG. 2B, the controller 216 or any other circuitry in the memory system 200 is configured to program the memory cells of a selected word line according to unique programming techniques discussed herein. At step 236, programming of a selected word line WLn begins. At step 238, the controller 216 determines which zone of the memory block the selected word line WLn is located within. At step 240, a maximum programming voltage VPGMmax is set based on the zone that the selected word line WLn is located within. At step 242, the controller programs the memory cells of the selected word line WLn in a plurality of program loops without a programming voltage VPGM exceeding the maximum programming voltage VPGMmax.

Figure 3:
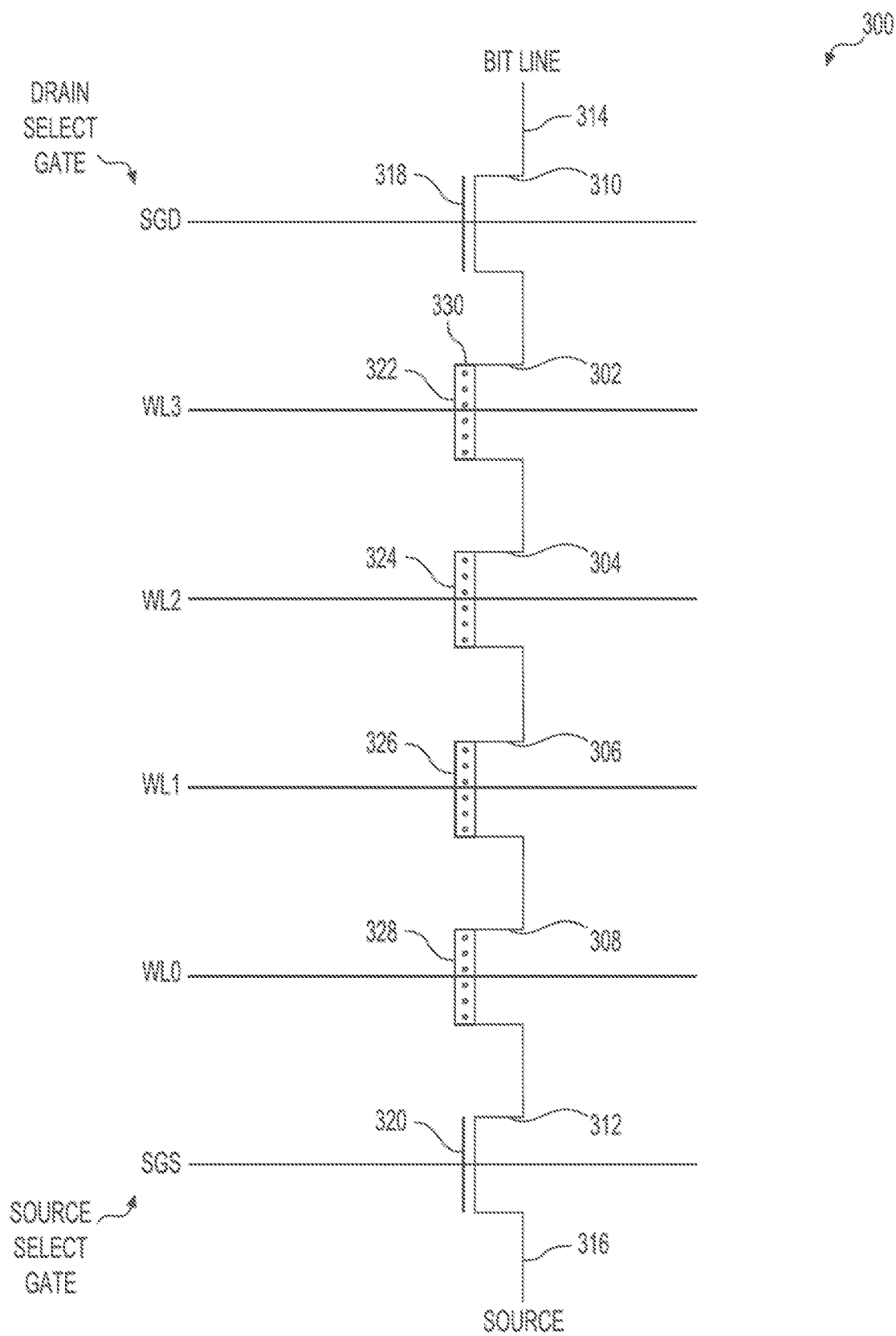
FIG. 3 is a schematic block diagram illustrating a NAND string according to aspects of the disclosure.

FIG. 3 depicts one embodiment of a NAND string 300 comprising a plurality of memory cells. The NAND string 300 depicted in FIG. 3, in some embodiments, includes four transistors (transistor 302, transistor 304, transistor 306, and transistor 308) connected in series and located between a first select transistor 310 and a second select transistor 312. In some embodiments, the transistor 302, transistor 304, transistor 306, and transistor 308 each include a control gate with a charge trap layer 330. Control gate 322, control gate 324, control gate 326, and control gate 328, in one embodiment, are connected to, or comprise portions of word lines WL0-WL3 respectively. In a further embodiment, transistor 302, transistor 304, transistor 306, and transistor 308 are memory cells, storage elements, or the like, also referred to as memory cells. In some embodiments, a single memory cell may include multiple transistors.

The first select transistor 310, in some embodiments, gates/connects the NAND string 300 to a bit line 314 via a drain select gate/select gate drain (SGD). The second select transistor 312, in certain embodiments, gates/connects the NAND string 300 to a source line 316 via a source select gate/select gate source (SGS). The first select transistor 310, in a further embodiment, is controlled by applying a voltage to a corresponding select gate 318. The second select transistor 312, in some embodiments, is controlled by applying a voltage to corresponding select gate 320.

As shown in FIG. 3, the source line 316, in one embodiment, is connected to the sources of each transistor/memory cell in the NAND string 300. The NAND string 300, in some embodiments, may include some memory cells that have been programmed and some memory cells that have not been programmed.

Figure 4:
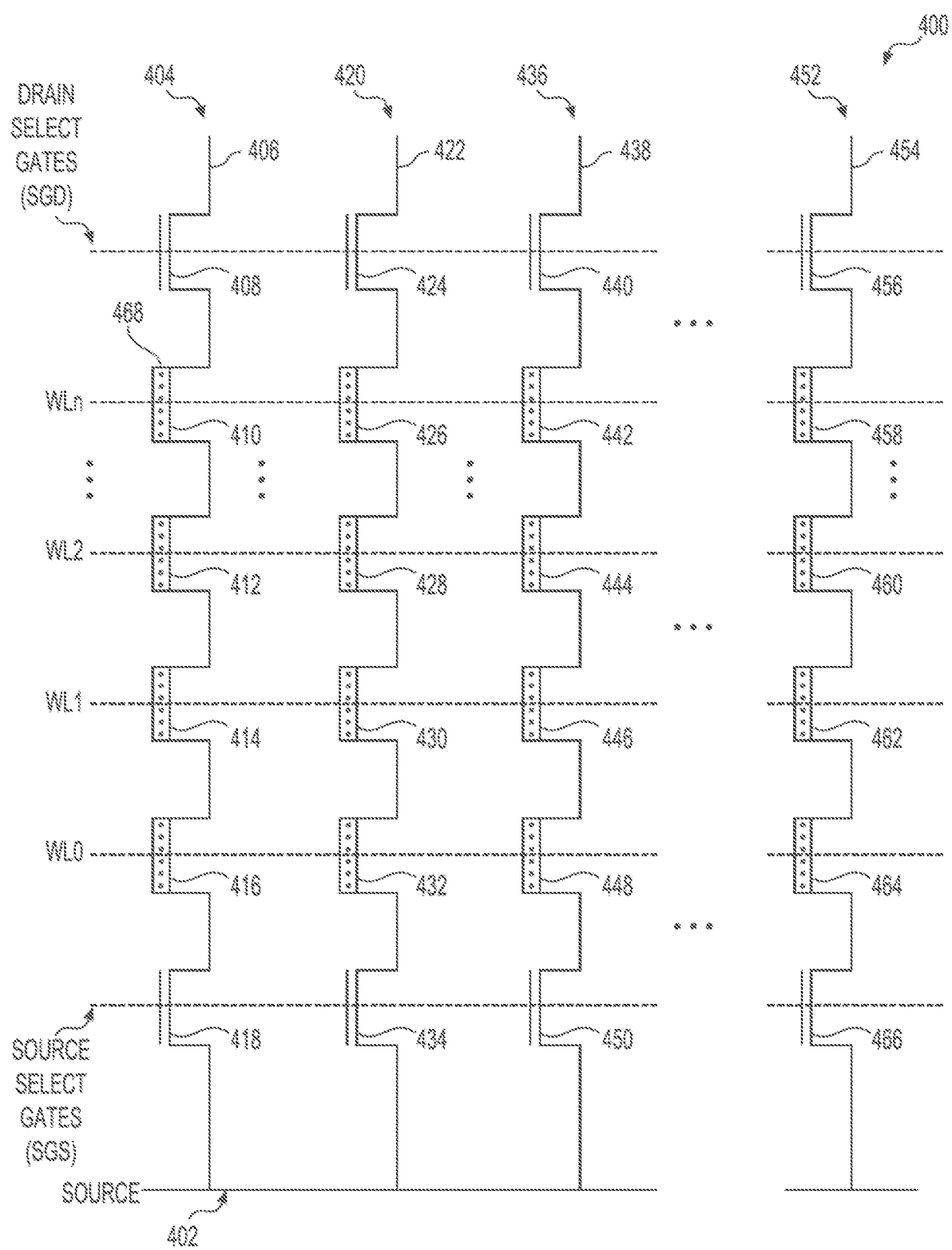
FIG. 4 is a schematic block diagram illustrating a memory array according to aspects of the disclosure.

FIG. 4 is a circuit diagram depicting a memory array 400 comprising a plurality of NAND strings. An architecture for a memory array using a NAND structure may include a significant number of NAND strings. For example, FIG. 4 illustrates a memory array 400 that includes NAND string 404, NAND string 420, NAND string 436, and NAND string 452. In the depicted embodiment, each NAND string includes drain select transistors (select transistor 408, select transistor 424, select transistor 440, and select transistor 456), source select transistors (select transistor 418, select transistor 434, select transistor 450, select transistor 466), and memory cells (memory cell 410, memory cell 412, memory cell 414, memory cell 416, memory cell 426, memory cell 428, memory cell 430, memory cell 432, memory cell 442, memory cell 444, memory cell 446, memory cell 448, memory cell 458, memory cell 460, memory cell 462, and memory cell 464). The memory cells may be transistors that incorporate a charge trap layer 468. While four memory cells per NAND string are illustrated for simplicity, some NAND strings can include any number of memory cells, e.g., thirty-two, sixty-four, or the like memory cells.

NAND string 404, NAND string 420, NAND string 436, and NAND string 452, in one embodiment, are connected to a source line 402 by source select transistor 418, select transistor 434, select transistor 450, and select transistor 466, respectively. A source select line SGS may be used to control the source side select transistors, 418, 434, 450, 466. The various NAND strings, in one embodiment, are connected to bit line 406, bit line 422, bit line 438, and bit line 454 by drain select transistor 408, select transistor 424, select transistor 440, and select transistor 456, respectively, as shown. The drain select transistors may be controlled by a drain select line SGD. In some embodiments, the select lines do not necessarily need to be in common among the NAND strings; that is, different select lines can be provided for different NAND strings.

As described above, each word line WL0-WLn connects one or more memory cells. In the depicted embodiment, bit line 406, bit line 422, bit line 438, and bit line 454, and the respective NAND string 404, NAND string 420, NAND string 436, and NAND string 452, form the respective columns of the memory array 400, storage block, memory block, or the like. These columns may also be referred to as channels. The word lines WL0-WLn, in some embodiments, comprise the rows of the memory array 400, storage block, memory block, or the like. Each word line WL0-WLn, in some embodiments, connects the control gates of each memory cell in a row. Alternatively, the control gates may be provided by the word lines WL0-WLn themselves. In some embodiments, a word line WL0-WLn may include tens, hundreds, thousands, millions, or the like of memory cells.

In one embodiment, each memory cell is configured to store data. For example, when storing one bit of digital data, the range of possible threshold voltages ("Vt") of each memory cell may be divided into two ranges which are assigned logical data "1" and "0." As used herein, threshold voltage refers to a magnitude of voltage applied to the gate of a memory cell sufficient to cause the memory cell to activate. In embodiments, in which the memory cell is a NAND transistor, the threshold voltage is a sufficient voltage applied to a gate terminal of the transistor that causes the transistor to conduct current between its source terminal and drain terminal. In one example of a NAND type flash memory, the Vt may be negative after the memory cells are erased, and defined as logic "1." In one embodiment, the Vt after a program operation is positive and defined as logic "0."

When the Vt is negative and a read is attempted, in some embodiments, memory cells will turn on to indicate logic "1" is being stored. When the Vt is positive and a read operation is attempted, in a further embodiment, a memory cell will not turn on, which indicates that logic "0" is stored. Each memory cell may also store multiple levels of information, for example, multiple bits of digital data. In such an embodiment, the range of Vt value is divided into the number of levels of data. For example, if four levels of information can be stored in each memory cell, there will be four Vt ranges assigned to the data values "11", "10", "01", and "00."

In one example of a NAND type memory, the Vt after an erase operation may be negative and defined as "11." Positive Vt values may be used for the states of "10", "01", and "00." In one embodiment, the specific relationship between the data programmed into the memory cells and the threshold voltage ranges of the memory cells depends upon the data encoding scheme adopted for the memory cells.

Figure 5:
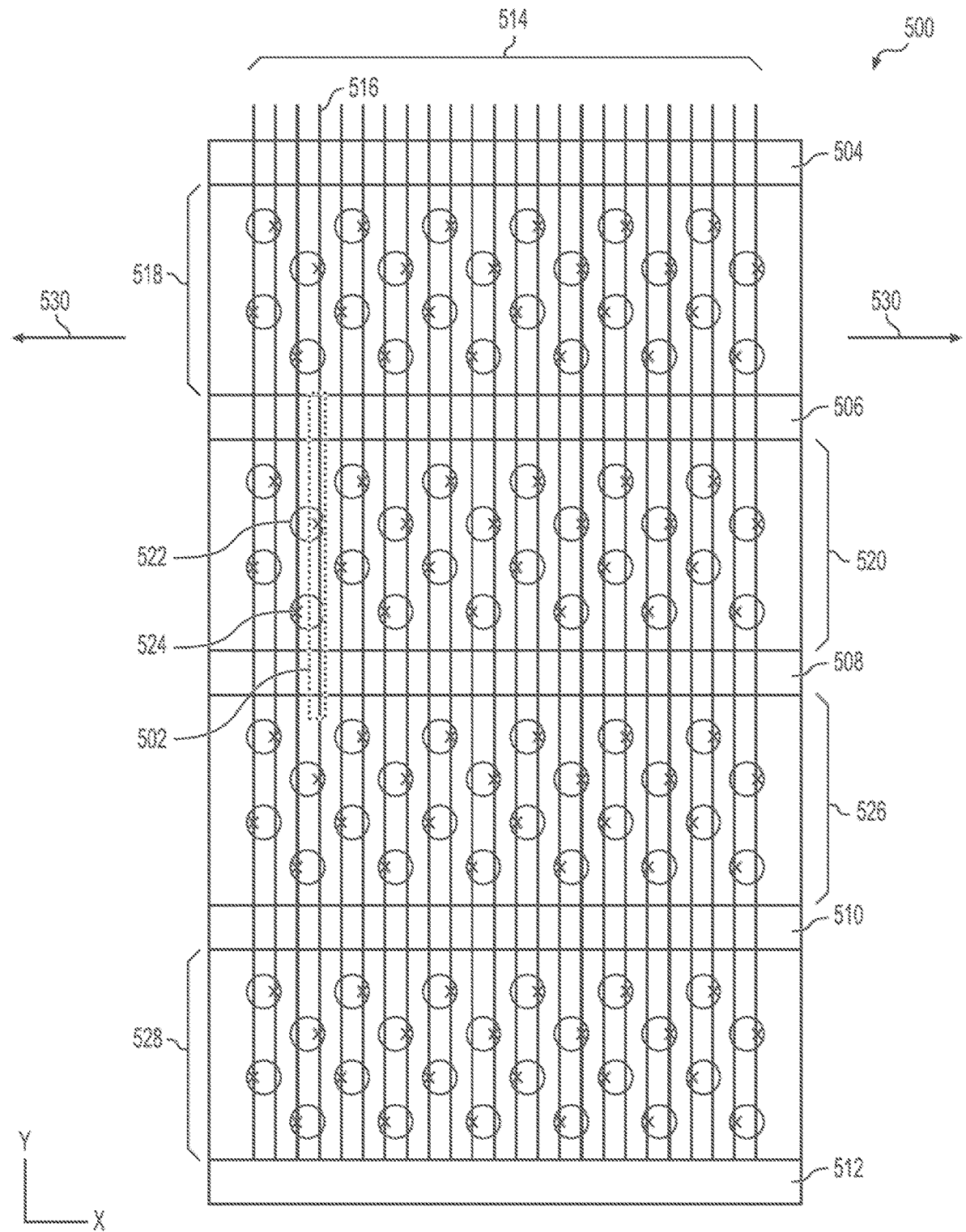
FIG. 5 illustrates one embodiment of a top view of a portion of a memory array according to aspects of the disclosure.
Figure 6:
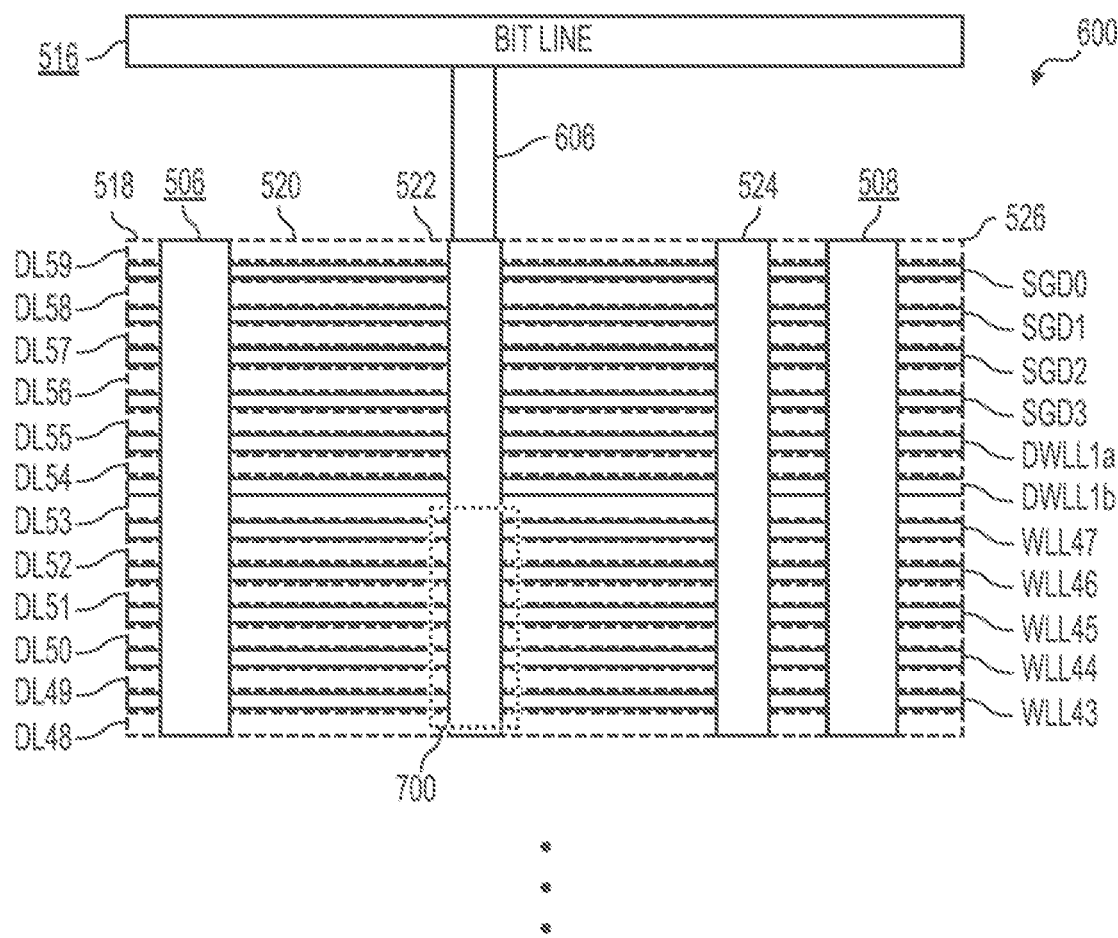
FIG. 6 illustrates one embodiment of a cross-sectional view of a portion of a memory array according to aspects of the disclosure.
Figure 6:
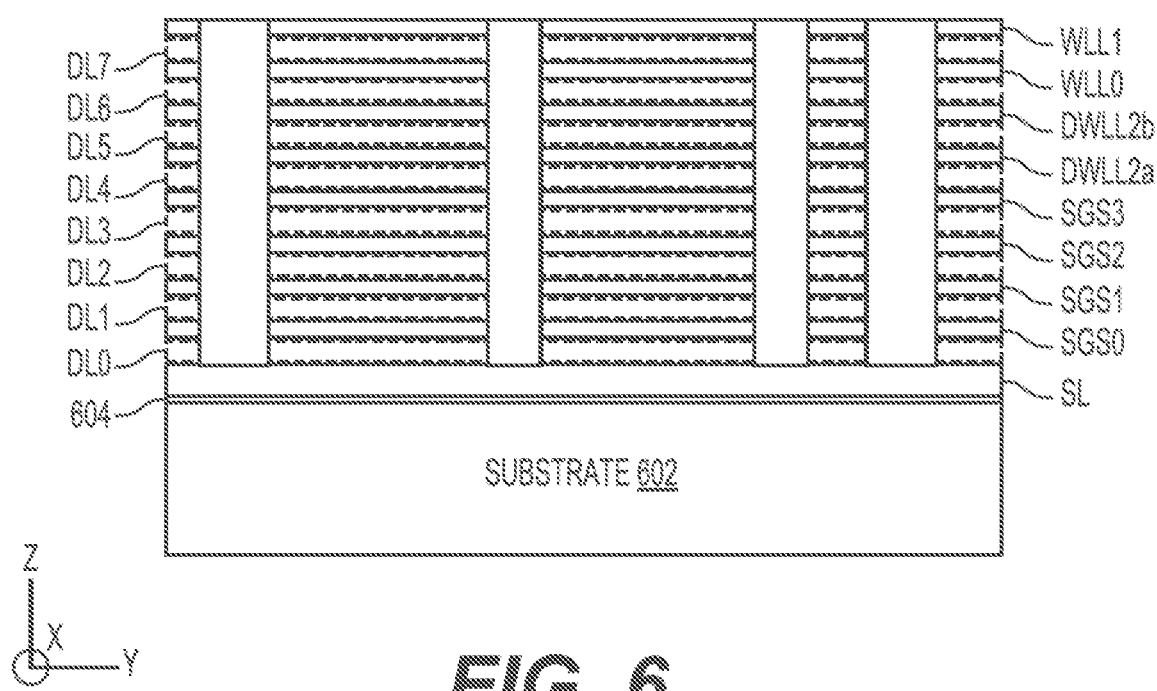
Figure 7:
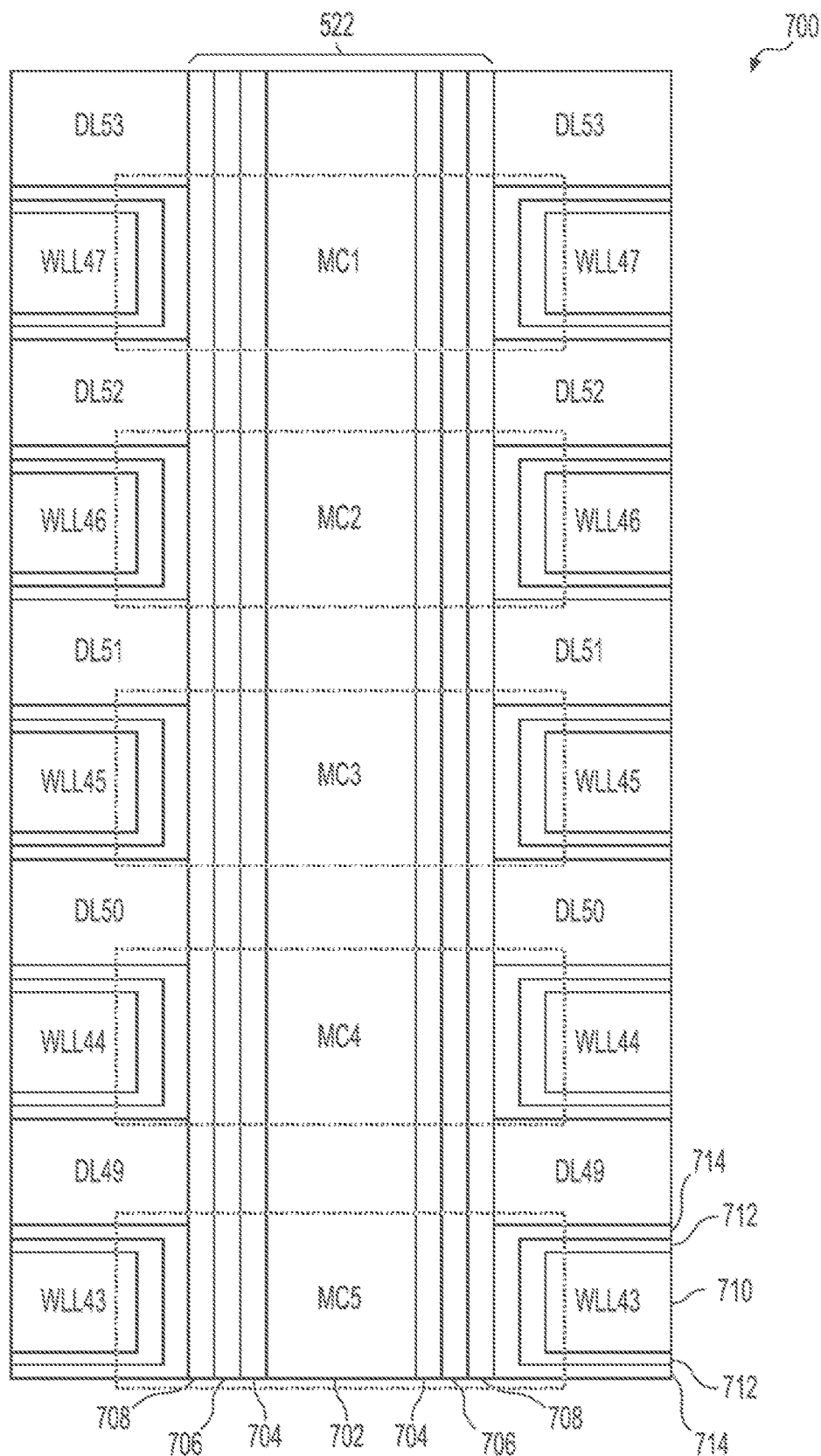
FIG. 7 illustrates a cross-sectional view of a memory array according to aspects of the disclosure.

FIGS. 5-7 depict different views of an example three dimensional memory array. FIG. 5 is a block diagram depicting a top view of a portion of three dimensional memory array. As can be seen from FIG. 5, the memory array extends 530 in the direction of the arrows shown. In one embodiment, the memory array may have between 60-128 layers. Other embodiments may have less than or more than 60-128 layers. However, FIG. 5 shows the top layer.

FIG. 5 depicts a top view of a portion of a memory array 500. A plurality of circles represent the vertical columns (e.g., vertical column 522 and vertical column 524 also referred to as channels). Each of the vertical columns includes multiple select transistors and multiple memory cells. In one embodiment, each of the vertical columns implements a NAND string. More details of the vertical columns are provided below. Since the memory array extends 530 in the direction of the two arrows shown, a memory block includes more vertical columns 522 than depicted in FIG. 5.

FIG. 5 also depicts a set of bit lines 514. FIG. 5 shows twenty-four bit lines because only a portion of a memory block is depicted. It is contemplated that more than twenty-four bit lines are connected to vertical columns of the memory block. Each of the circles representing vertical columns has an "x" to indicate its connection to one bit line 516.

The portion of memory block depicted in FIG. 5 includes a set of openings (trench 504, trench 506, trench 508, trench 510, and trench 512). A trench separates layers of the three-dimensional array so that smaller divisions can be used in particular storage operations. For example, in FIG. 5, the trenches, together with separate source line connections, break up a monolithic memory array into portions 518, 520, 526, 528 of four illustrated memory blocks. These trenches facilitate performing an erase operation on one memory block without adversely impacting other memory blocks. Trenches may also be used for other routing signals and in such embodiments be referred to as interconnects or local interconnects. For example, in one embodiment, connections to a source gate select line may connect to the source line by way of a line within one or more trenches.

Although FIG. 5 shows each region having four rows of vertical columns, four portions and sixteen rows of vertical columns, those exact numbers are an example implementation. Other embodiments may include more or less regions, more or less rows of vertical columns per region and more or less rows of vertical columns per block.

FIG. 5 also shows the vertical columns being staggered. In other embodiments, different patterns of staggering can be used. In some embodiments, the vertical columns are not staggered.

FIG. 6 depicts a portion of an embodiment of the non-volatile memory media 120 showing a cross-sectional view of a portion of a memory array 600. As indicated in FIG. 5, this cross-sectional view cuts through vertical column 522 and vertical column 524 and 520 (see FIG. 5). The structure of FIG. 6 includes four drain side select layers SGD0, SGD1, SGD2, and SGD3; four source side select layers SGS0, SGS1, SGS2, and SGS3; four dummy word line layers DWLL1 a, DWLL1 b, DWLL2 a, and DWLL2 b; and forty-eight data word line layers WLL0-WLL47 for connecting to data memory cells. Other embodiments can implement more or less than four drain side select layers, more or less than four source side select layers, more or less than four dummy word line layers, and more or less than forty-eight word line layers. Vertical column 522 and vertical column 524 are depicted protruding through the drain side select layers, source side select layers, dummy word line layers and word line layers. In one embodiment, each vertical column comprises a NAND string. Below the vertical columns and the layers listed below is a substrate 602, an insulating film 604 on the substrate 602, and source line 316 (SL). The NAND string of vertical column 522 has a source end at a bottom of the stack and a drain end at a top of the stack. As in agreement with FIG. 5, FIG. 6 shows vertical column 522 connected to bit line 516 via connector 606. Trench 506 and trench 508 are also depicted. Portions of a memory block 518 and 526 extend to either side of the portion shown.

For ease of reference, drain side select layers SGD0, SGD1, SGD2, and SGD3; source side select layers SGS0, SGS1, SGS2, and SGS3; dummy word line layers DWLL1 a, DWLL1 b, DWLL2 a, and DWLL2 b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten, or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from SiO2. In other embodiments, other dielectric materials may be used to form the dielectric layers.

The non-volatile memory cells are formed along vertical columns (also referred to as channels) which extend through alternating conductive and dielectric layers in the stack. In one embodiment, the memory cells are arranged in NAND strings. The word line layers WLL0-WLL47 connect to memory cells (also called memory cells or data memory cells). Dummy word line layers DWLL1 a, DWLL1 b, DWLL2 a, and DWLL2 b connect to dummy memory cells. A dummy memory cell does not store user data, while a data memory cell is eligible to store user data. Drain side select layers SGD0, SGD1, SGD2, and SGD3 are used to electrically connect and disconnect NAND strings from bit lines. Source side select layers SGS0, SGS1, SGS2, and SGS3 are used to electrically connect and disconnect NAND strings from the source line 316 SL. The memory array 700 shown is illustrated in more detail in FIG. 7.

FIG. 7 illustrates a cross-sectional view of a memory array 700. In one embodiment, the vertical column 522 is round and includes four layers; however, in other embodiments more or less than four layers can be included and other shapes can be used (e.g., a "U" shape instead of an "I" shape or the like). In one embodiment, a vertical column 522 includes an inner core layer 702 that is made of a dielectric, such as SiO2. Other materials can also be used. Surrounding the inner core layer 702 is a polysilicon channel 704. Materials other than polysilicon can also be used. Note that it is the channel 704 that connects to the bit line. Surrounding the channel 704 is a tunneling dielectric 706. In one embodiment, tunneling dielectric 706 has an ONO structure. Surrounding the tunneling dielectric 706 is a shared charge trapping layer 708, such as (for example) Silicon Nitride. Other materials and structures can also be used. The technology described herein is not limited to any particular material or structure.

FIG. 7 depicts dielectric layers DL49, DL50, DL51, DL52, and DL53, as well as word line layers WLL43, WLL44, WLL45, WLL46, and WLL47. Each of the word line layers includes a word line region 710 surrounded by an aluminum oxide layer 712, which is surrounded by a blocking oxide layer 714, which may be of SiO2. The physical interaction of the word line layers with the vertical column forms the memory cell (also referred to as a memory cell). Thus, a memory cell, in one embodiment, comprises channel 704, tunneling dielectric 706, charge trapping layer 708 (e.g., shared with other memory cells), blocking oxide layer 714, aluminum oxide layer 712 and word line region 710. In some embodiments, the blocking oxide layer 714 and aluminum oxide layer 712, may be replaced by a single layer of material with insulating properties or by more than 2 layers of different material with insulating properties. Furthermore, the materials used are not limited to silicon dioxide (SiO2) or aluminum oxide.

For example, word line layer WLL47 and a portion of vertical column 522 comprise a memory cell MC1. Word line layer WLL46 and a portion of vertical column 522 comprise a memory cell MC2. Word line layer WLL45 and a portion of vertical column 522 comprise a memory cell MC3. Word line layer WLL44 and a portion of vertical column 522 comprise a memory cell MC4. Word line layer WLL43 and a portion of vertical column 522 comprise a memory cell MC5. In other architectures, a memory cell may have a different structure; however, the memory cell would still be the data storage unit.

When a memory cell is programmed, electrons are stored in a portion of the charge trapping layer 708 which is associated with the memory cell. These electrons are drawn into the charge trapping layer 708 from the channel 704 through the tunneling dielectric 706, in response to an appropriate voltage on word line region 710. The threshold voltage (Vt) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Memory cells in the same location or position in different memory structures (e.g., different NAND strings) on different bit lines, in certain embodiments, may be on the same word line. Each word line may store one page of data, such as when 1-bit of data is stored per single-level cell (SLC); two pages of data, such as when 2-bits of data are stored per multi-level cell (MLC); three pages of data, such as when 3-bits of data are stored per triple-level cell (TLC); four pages of data, such as when 4-bits of data are stored per quad-level cell (QLC); or another number of pages of data.

In the depicted embodiment, a vertical, 3D NAND flash memory structure comprises an "I" shaped memory structure. In other embodiments, a vertical, 3D NAND flash memory structure may comprise a "U" shaped structure, or may have another vertical and/or stacked architecture. In certain embodiments, four sets of strings (e.g., four sets of 48 word lines, or another predefined number of word lines) may form a memory block, while in other embodiments, fewer or more than four sets of strings may form a memory block. As may be appreciated, any suitable number of memory cells may be part of a single NAND string. In one embodiment, a NAND string includes forty-eight (48) memory cells. In other embodiments, a NAND string includes one hundred and twelve (112) or more memory cells.

Figure 8:
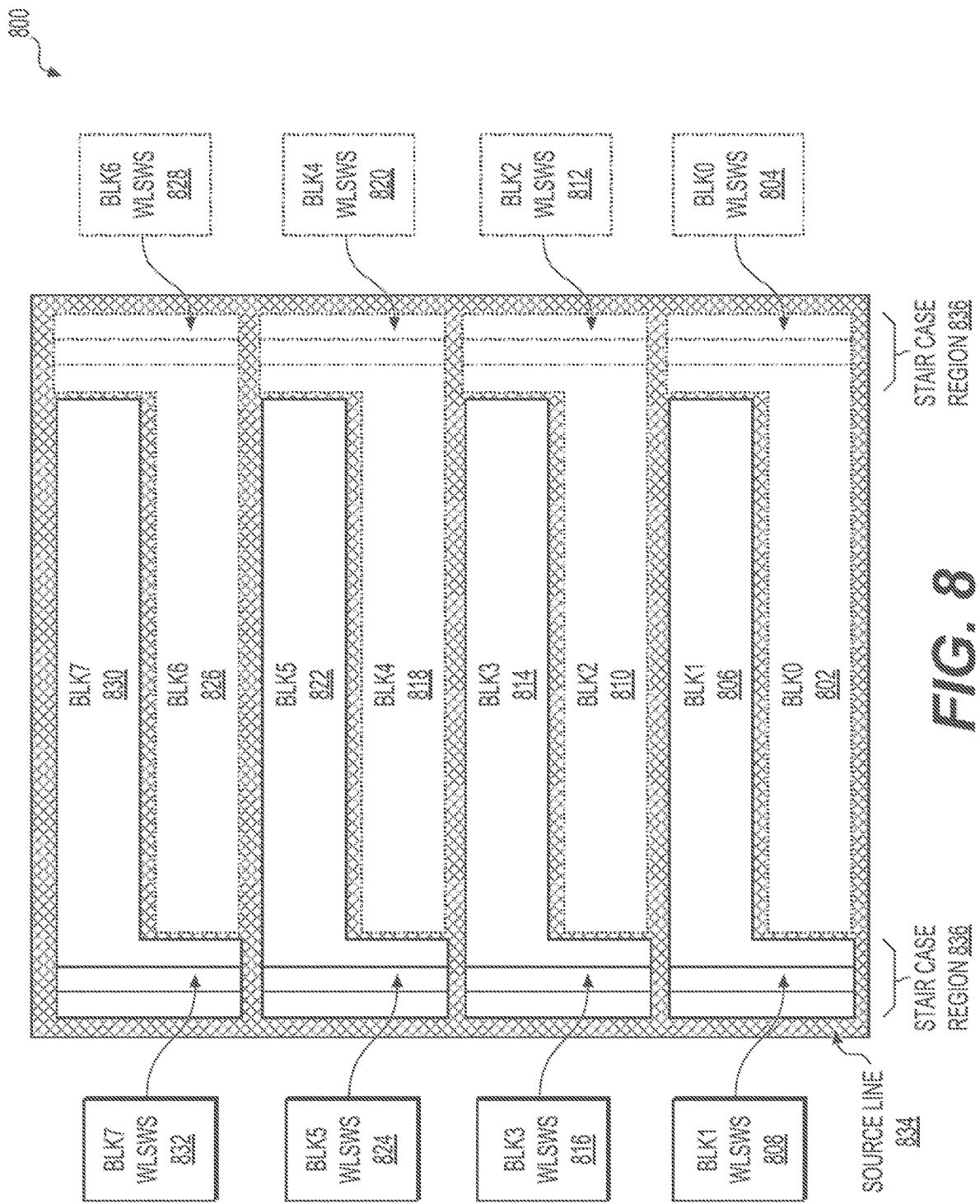
FIG. 8 illustrates a word lines driven from one side in accordance with the prior art.

FIG. 8 shows word lines driven from one side 800. Eight memory blocks of memory are shown: BLK0 802, BLK1 806, BLK2 810, BLK3 814, BLK4 818, BLK5 822, BLK6 826, and BLK7 830. Note that these numbers are used solely for labeling purposes, and are not intended to represent an exact physical location within a memory array. These memory blocks may be configured as described in FIG. 5-FIG. 7.

As used herein, a "memory block" comprises a set of memory cells organized within a memory array such that an erase storage operation impacts each of the memory cells within the memory block. Ideally, each memory cell of the memory block transitions to an erased state due to the erase storage operation. In practice, certain memory cells may not transition to an erased state and therefore are in an error state due to not erasing properly.

A single conductive layer may underlie all of the memory blocks and provide a common source line 834. This corresponds to the source line 402 shown in FIG. 4. To the left and the right side of each memory block, as this drawing is oriented, a stair case region 836 may exist. In this region 836, connections may be made between word line layers and high voltage WLSWs which are connected of one or more voltage sources that are referred to herein as drivers. The gates used to drive memory command signals and to switch those signals to specific locations in memory may, at least in part, reside in, and connect through, the stair case region 836.

Word lines are conventionally driven from only one side because of the area required for the row decoder logic illustrated in FIG. 2. (e.g., row decoder A 218 and row decoder B 220) In a conventional architecture for the memory array, the silicon area needed for the row decoders to drive each word line from both sides would need to be twice the conventional area used for row decoders that drive each word line from only one side.

In a conventional memory array, the row decoders on either side of the memory array are configured to drive half of the word lines and/or memory blocks. In order to accommodate the logic and connections needed for each block, a conventional die layout alternates which sets of high voltage WLSWs of the stair case region 836 adjacent to a memory block will connect to and drive the word lines within the memory block.

This alternating connection pattern is illustrated in FIG. 8 using solid and dotted lines to show which stair case region comprising the word line switches (WLSWs) that control each memory block. Starting at the bottom, BLK0 802 is controlled and/or driven by the BLK0 WLSWs 804 located to the right, while BLK1 806 is controlled and/or driven by the BLK1 WLSWs 808 to the left. BLK2 810 is controlled and/or driven by BLK2 WLSWs 812 to the right, and BLK3 814 is controlled and/or driven by BLK3 WLSWs 816 to the left. BLK4 818 is controlled and/or driven by BLK4 WLSWs 820, BLK5 822 by BLK5 WLSWs 824, BLK6 826 by BLK6 WLSWs 828, and BLK7 830 by BLK7 WLSWs 832.

Figure 9:
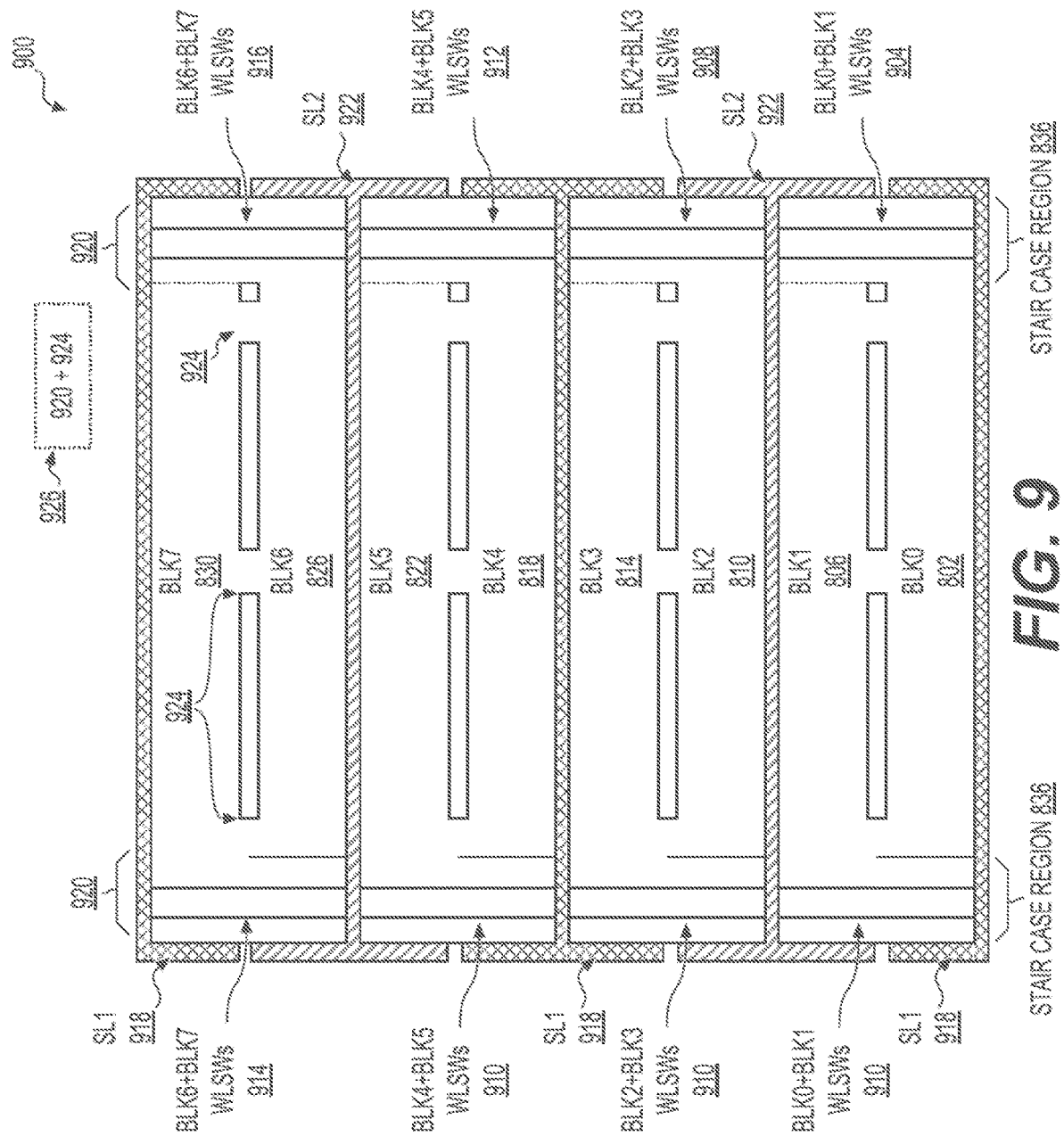
FIG. 9 illustrates a memory array according to aspects of the disclosure.

FIG. 9 illustrates a top down view of a memory array 900 in accordance with one embodiment. Certain details are not illustrated (e.g., bit lines and vertical columns) for clarity in illustrating other elements.

The memory array 900 includes a three-dimensional array of memory cells organized into rows and columns. The rows comprise a plurality of word lines and the columns connect to bit lines. The word lines are organized into memory blocks BLK0 802, BLK1 806, BLK2 810, BLK3 814, BLK4 818, BLK5 822, BLK6 826, and BLK7 830.

Memory cells within the memory array connect to the die controller 206 by way of row decoder A 218, row decoder B 220, column decoder A 226, and column decoder B 228. The die controller 206 supplies voltages and/or currents to circuits and logic of the decoders to implement storage operations such as reading memory cells, writing memory cells, and/or erasing memory cells.

In particular, the row decoders and/or column decoders include logic, such as switches, for selectively connecting the memory cells to a voltage driver such as, voltage driver 234 (See FIG. 2). In one embodiment, the memory array includes a connection circuit. A connection circuit is any electrical circuit configured to electrically couple one or more circuit drivers (voltage and/or current) to two ends of a word line. In certain embodiments, a connection circuit includes one or more gates or switches to enable either selective coupling, or substantially simultaneous coupling, of certain components to the driver(s). The connection circuit provides an electrical conductive path that includes one or more word lines in a first set of word lines, one or more word lines in a second set of word lines and a common driver, such as voltage driver 234.

In certain embodiments, the connection circuit includes a plurality of switches (e.g., 902, 904, 906, 908, 910, 912, 914, 916) positioned in the stair case region 836. The switches selectively connect each word line of a memory block to the voltage driver 234. In one embodiment, the switch is a transistor with one terminal in electrical communication to a word line and the other terminal in electrical communication with the voltage driver 234 and the gate in electrical communication with the die controller 206 (e.g., state machine 208).

In the embodiment illustrated in FIG. 9, the connection circuit 926 electrically connects a first word line in one memory block, (e.g., BLK0 802) and a second word line in an adjacent memory block, (e.g., BLK1 806) to the same voltage driver 234. In certain embodiments, the connection circuit 926 includes circuits, logic, or the like, to enable the state machine 208 to activate a switch positioned on one side of the memory block (e.g., BLK0 802) and to substantially simultaneously activate a switch positioned on an opposite end of the memory block (e.g., BLK1 806). In this manner, the state machine 208, voltage driver 234, and connection circuit 926 work together to supply a voltage signal (e.g., bias) to both the second word line and the first word line from both ends at substantially the same time.

As used herein, an adjacent memory block comprises a memory block positioned next to or in close proximity to an existing memory block, with no other memory blocks between them. In the embodiment illustrated in FIG. 9, BLK0 802 and BLK1 806 are representative examples of adjacent memory blocks. Conversely, BLK0 802 and BLK2 810 are not adjacent memory blocks because BLK1 806 is positioned between them.

As mentioned above, analog circuits, such as those of the word lines, experience resistive-capacitive (RC) loading when a voltage is applied. As explained in relation to FIG. 3, voltage applied to the word line is applied to the gate of the memory cells along the word line to bias a memory cell for a storage operation.

A memory array 900 configured with the state machine 208, voltage driver 234 (see FIG. 2), and connection circuit 926 adjusts a voltage signal (e.g., bias) on the second word line and the first word line from both ends at substantially the same time which mitigates delay caused by RC loading. FIG. 8 illustrates an embodiment from a top view, consequently, details of connections between one word line in a selected memory block, such as BLK0 802 and another word line in an unselected memory block, such as word line layers and/or connection circuits of the memory array that are below this top level view are not shown here for clarity. However, these details are included in subsequent figures of other embodiments. It should be noted that in the embodiments described herein, each word line within a selected memory block of a three-dimensional array is coupled to a corresponding word line in an adjacent memory block of the three-dimensional array.

In order to reduce the latency incurred in propagating a signal across the entire length of a word line, in some embodiments, the WLSWs (of the connection circuit) may be located on both sides of a pair of adjacent memory blocks to drive signals onto word line layers from both ends.

As illustrated, in the depicted embodiment, WLSWs located in both stair case regions are used to drive the even and odd adjacent memory blocks.

BLK0+BLK1 WLSWs 902 and BLK0+BLK1 WLSWs 904 both drive BLK0 802 as well as BLK1 806. BLK2+BLK3 WLSWs 906 and BLK2+BLK3 WLSWs 908 drive BLK2 810 and BLK3 814. BLK4+BLK5 WLSWs 910 and BLK4+BLK5 WLSWs 912 drive BLK4 818 and BLK5 822. BLK6+BLK7 WLSWs 914 and BLK6+BLK7 WLSWs 916 drive BLK6 826 and BLK7 830.

Additionally, using switches on both sides to drive both memory blocks, rather than alternating driving gates for a single memory block from one side to the other, reduces the RC delay and propagation latency, without increasing the row decoder (e.g., row decoder A 218, row decoder B 220) layout area.

Generally, the word lines of the memory array 900 experience voltages ranging from about 0 volts to about 20 volts. In embodiments in which the connection circuit 926 includes switches that connect both sides of one or more word lines to a common driver 234 (illustrated in FIG. 2) and the switches comprise transistors, the transistors are large in comparison to other CMOS components of the memory array 900. Consequently, WLSWs for one memory block may occupy space vertically aligned with word lines of an adjacent memory block as well as space vertically aligned with word lines of a particular memory block. For example, in FIG. 9, switches of BLK0+BLK1 WLSWs 904 connect to both BLK0 802 and BLK1 806 using the same area that other designs used to connect to a single memory block.

In one embodiment, the connection circuit 926 includes both one or more external conductive links 920 and one or more internal conductive links 924. External conductive links 920 are electrical components external to (outside the perimeter of) a memory array that are configured to conduct, or pass, a voltage or current between two word lines of the memory array and voltage driver 234. Examples of external conductive links 920 and/or components that may comprise one or more external conductive links 920, include, but are not limited to, wires, leads, traces, metal lines, resistors, conductors, capacitors, inductors, switches, and the like.

Internal conductive links 924 are electrical components internal to (within the perimeter of) a memory array that are configured to conduct, or pass, a voltage or current between two word lines of the memory array and voltage driver 234. Examples of internal conductive links 924 and/or components that may comprise one or more internal conductive links 924, include, but are not limited to, wires, leads, traces, metal lines, resistors, conductors, capacitors, inductors, switches, and the like. In one embodiment, the connection circuit includes just external conductive links 920 and no internal conductive links 924.

As used herein, a "selected" component refers to a component that a command, instruction, or controller, such as a die controller 206 or storage controller 216 is targeting/addressing/selecting for a particular operation. Examples of such references include selected WLSW, selected memory cell, selected page of memory cells, selected word line, selected memory block, selected plane, selected memory die, and the like. As used herein, an "unselected" component refers to a component that a command, instruction, or controller, such as a die controller 206 or storage controller 216 is not targeting/addressing/selecting for a particular operation. Examples of such references include unselected WLSW, unselected memory cell, unselected page of memory cells, unselected word line, unselected memory block, unselected plane, unselected memory die, and the like. The operation may comprise an internal testing or maintenance operation (e.g., garbage collection, test mode operation), a user command/request, or a particular storage operation such as a read operation, write operation, or erase operation.

Figure 10:
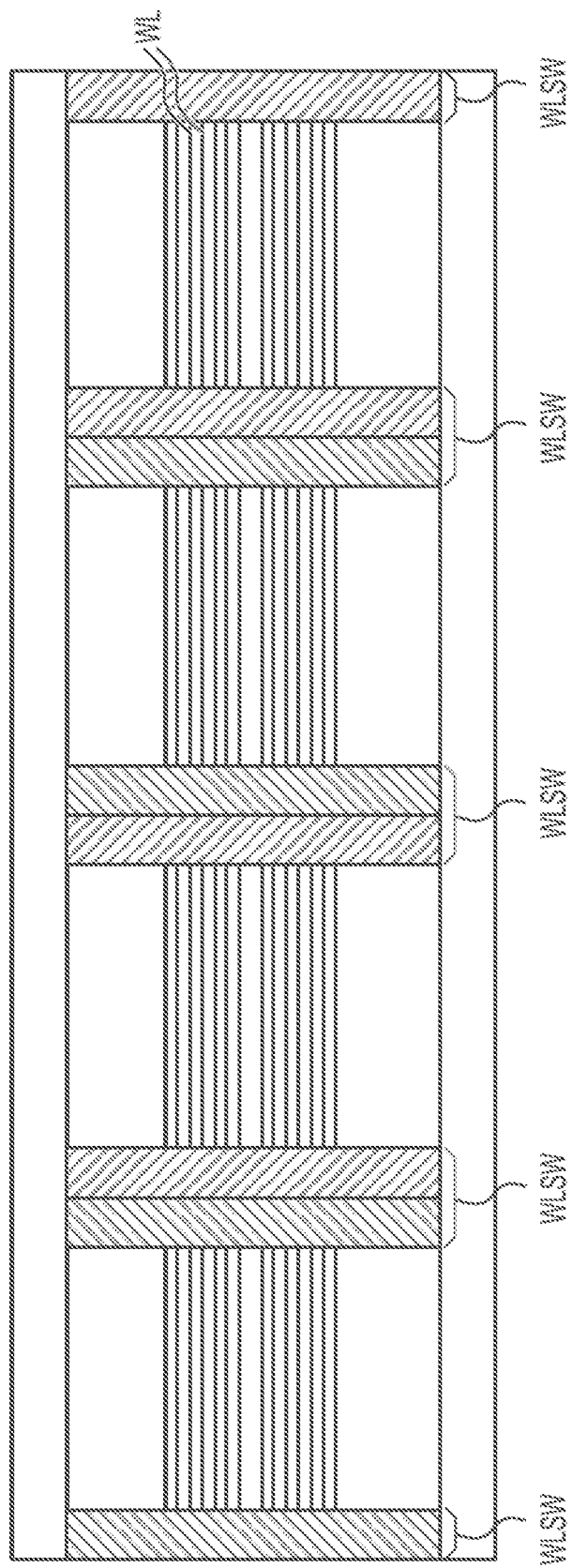
FIG. 10 shows a side cross-sectional view of an example memory die and illustrates a portion of the die in which word line switches reside according to aspects of the disclosure.

As mentioned above, the quantity of WLSWs per memory block increases as memory devices utilize an increasing quantity of word lines in each memory block. As a result, a width a WLSW area of a CMOS layer of the memory die also increases. FIG. 10 shows a side cross-sectional view of an example memory die and illustrates a portion of the die in which WLSWs reside. The width of the area where the WLSWs are disposed (indicated as WLSW) depends on the quantity of the WLSWs, the width of each WLSW, and a shallow trench isolation (STI) space between each WLSW for providing electrical isolation. With structures such as CMOS bonded Array (CbA), the width of the area for the WLSWs is even more of an issue, because the array of memory cells can shrink dramatically. If the CMOS (complementary metal-oxide-semiconductor) footprint is larger than the array footprint, this can result in reduced chip area/cost efficiency.

Figure 11:
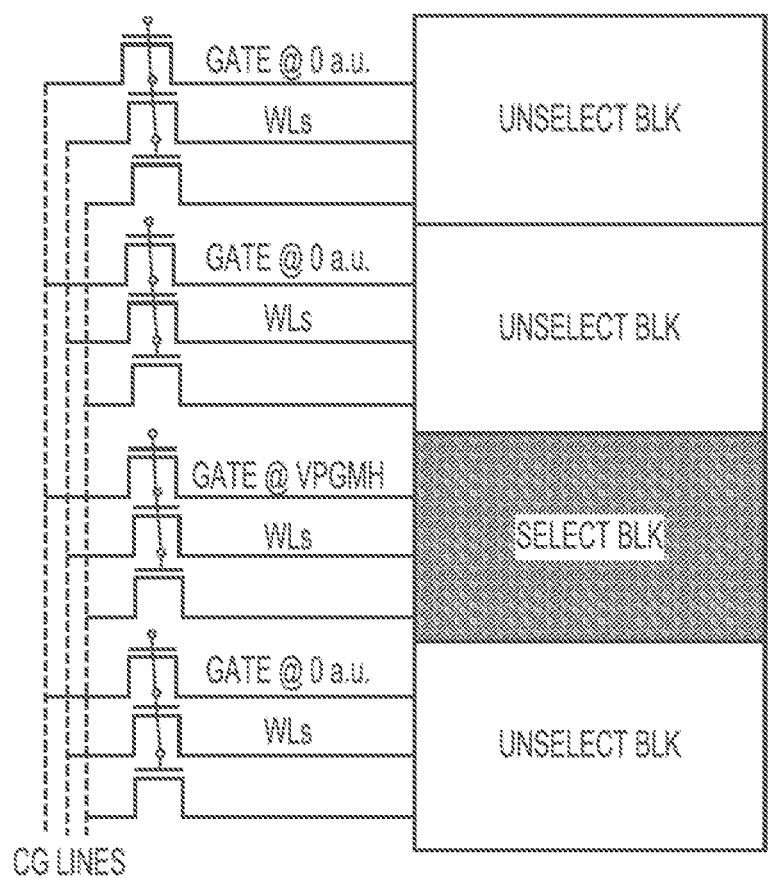
FIG. 11 shows word line switches connected to word lines of a selected block and multiple unselected blocks along with voltages applied to gates of the word line switches for two different schemes according to aspects of the disclosure.

One purpose of the WLSWs is avoid a transfer of the bias from the control gate (CG) lines to unselected blocks. FIG. 11 shows WLSWs connected to word lines of a selected block and multiple unselected blocks along with voltages applied to gates of the WLSWs for two different schemes. Specifically referring to the left hand side, approximately zero volts may be applied to the gates of the WLSWs of the unselected blocks, while a voltage VPGMH is applied to the gates of the WLSWs of the selected block to allow a program voltage VPGM to be passed to a selected word line of the selected block and to allow the pass voltage VPASS to be passed to the unselected word lines of the selected block.

Figure 12:
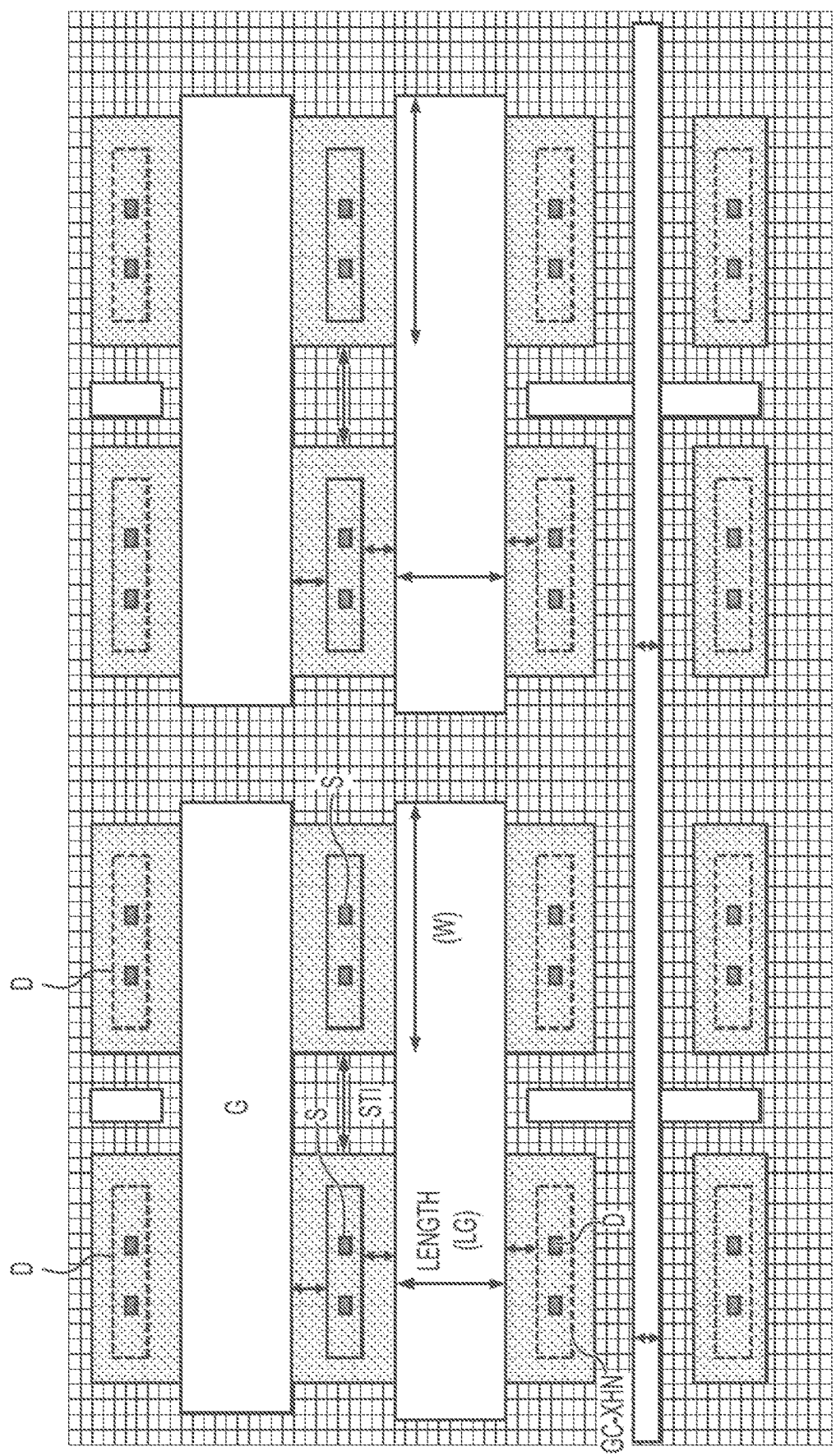
FIG. 12 shows a top cross-sectional view of a portion of an example memory die illustrating dimensions of word line switches including at least one width according to aspects of the disclosure.

FIG. 12 shows a top cross-sectional view of a portion of an example memory die illustrating dimensions of WLSWs including at least one width W and at least one length LG and at least one STI space between adjacent WLSWs.

Figure 13:
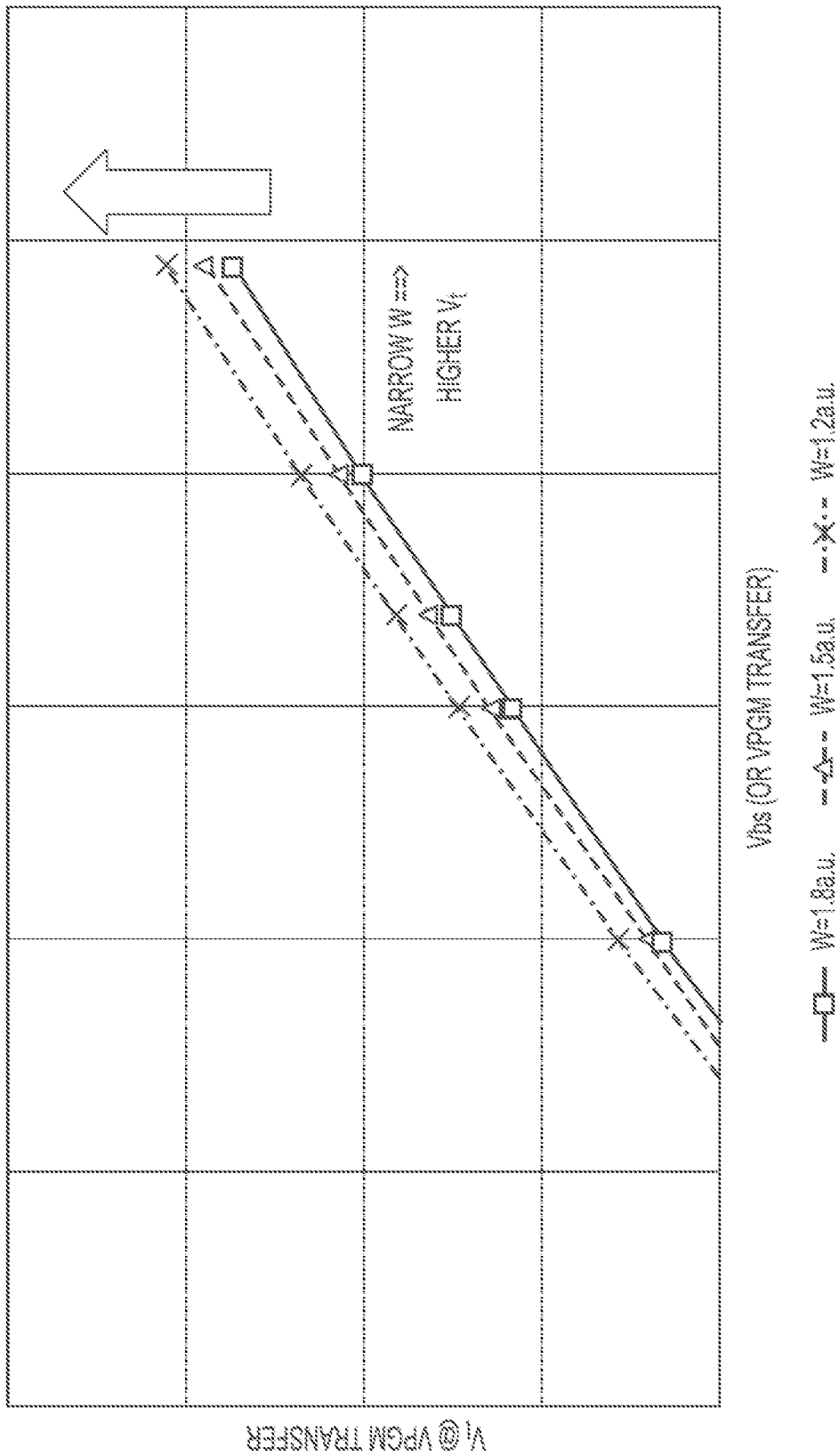
FIG. 13 is a plot of a switch threshold voltage of the word line switch versus a back bias of the word line switch for different widths of the word line switch according to aspects of the disclosure.

FIG. 13 is a plot of a switch threshold voltage Vt_WLSW of the WLSW versus a back bias Vbs of the WLSW for different widths of the WLSW. High voltage CMOS breakdown limits a maximum voltage of the WLSW Vwlswmax. The maximum voltage, which can be applied to the gate of the word line switch WLSW Vwlswmax, together with a maximum program voltage VPGMmax, determines the width of the WLSWs. So, the maximum voltage Vwlswmax of the WLSW equals the maximum program voltage VPGMmax plus an overdrive voltage Vov plus the switch threshold voltage Vt_WLSW of the WLSW when the switch is transferring maximum program voltage VPGMmax (Vwlswmax=VPGMmax+Vt_WLSW(@ Vb=VPGMmax)+Vov). Since the switch threshold voltage Vt_WLSW when the back bias Vbs of the WLSW equals the maximum program voltage VPGMmax increases with reducing width W, it places a constraint of minimum width W of the WLSW.

Consequently, described herein is a memory apparatus (e.g., memory device 200 of FIG. 2) including WLSWs (e.g., BLK0 WLSWs 804, BLK1 WLSWs 808, BLK2 WLSWs 812 BLK3 WLSWs 816 BLK4 WLSWs 820 BLK5 WLSWs 824 BLK6 WLSWs 828 BLK7 WLSWs 832 of FIG. 8 or BLK0+BLK1 WLSWs 902, BLK0+BLK1 WLSWs 904, BLK2+BLK3 WLSWs 906, BLK2+BLK3 WLSWs 908, BLK4+BLK5 WLSWs 910, BLK4+BLK5 WLSWs 912, BLK6+BLK7 WLSWs 914, BLK6+BLK7 WLSWs 916 of FIG. 9) coupled to a plurality of word lines (e.g., word line layers WLL43-WLL47 of FIG. 7) each connected to memory cells (e.g., memory cells MC1-MC5 of FIG. 7). The WLSWs are each configured to retain a switch threshold voltage Vt_WLSW and selectively connect one or more of the plurality of word lines to a common driver (e.g., common driver 1016 OF FIG. 10) for supplying voltages to the one or more of the plurality of word lines during a memory operation. The memory apparatus also includes a control circuit or means (e.g., one or any combination of controller 126 of FIG. 1, die controller 206, decoders 218, 220, 226, sense blocks SBb, SB2, . . . , SBp, read/write circuits 222, 224, controller 216 of FIG. 2 and so forth) coupled to the WLSWs. The control means is configured to apply predetermined select block switch voltages (e.g., voltage VPGMH applied to the gates of the WLSWs of the selected block to allow a program voltage VPGM to be passed to the word lines of the selected block as in FIG. 11) to a first set of the WLSWs connected to the plurality of word lines of a selected memory block during the memory operation.

Turning back to FIG. 12, the WLSWs are laid out in linear fashion in multiple rows with each WLSW including a peripheral area contact (source S) and two word line contacts (drains D). The two word line contacts D are electrically coupled with the same word line number in different memory blocks, e.g., one word line contact D is electrically connected with WL0 of a first block and the other word line contact D of the same WLSW is electrically connected with WL0 of a second block. Thus, each WLSW includes two switches for the same word line in two different blocks.

As discussed above, the width of each WLSW area (illustrated in FIG. 10) is dictated largely by three factors: (1) the number of WLSW in the area, (2) the widths W of the switches, and (3) the STI space between the WLSWs. For packaging and space utilization reasons, it is advantageous to minimize the sizes of the WLSW areas so as to ensure that a footprint of a CMOS layer of the chip is not larger than a footprint of an array layer of the chip. In some embodiments, the widths W of some of the WLSWs are reduced by making the maximum programming voltages VPGMmax dependent on the WLSW widths of the associated word lines. In other words, within a memory block, different word lines have different VPGMmax voltages and their WLSWs have different widths W. Thus, rather than all of the WLSWs having identical widths that are optimized for a single VPGMmax that's applied to all of the word lines, only some of the WLSWs have this maximum width and the other WLSWs have lesser widths W to reduce the total size of the WLSW area.

Figures 14, 15:
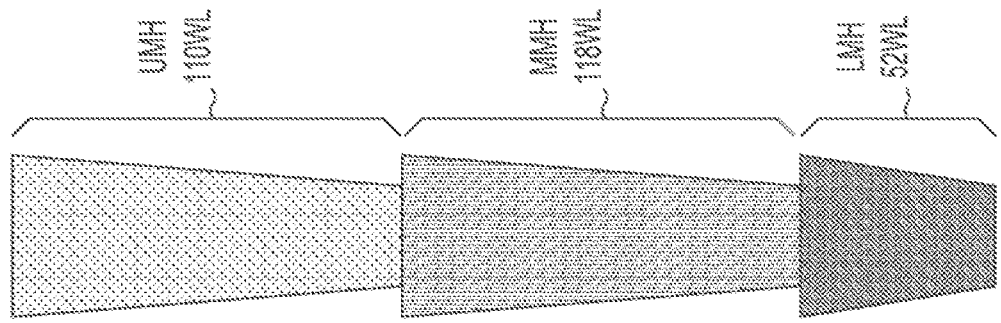
FIG. 14 is a schematic view of a three-tiered memory hole.
FIG. 15 is a plot of a plurality of word lines in an example memory block and the associated VPGMmax and Vwlswov voltages.

Turning now to FIG. 14, in an example embodiment, for each word line, VPGMmax is set according to a memory hole cross-sectional shape at that word line. For example, in a three-tiered structure, each NAND string has an upper memory hole, a middle memory hole, and a lower memory hole with the middle memory hole being located between the upper and lower memory holes. Each of these memory holes is generally upside-down cone-shaped and tapers from its top (drain side) to its bottom (source side). Consequently, the word lines that are aligned with the top sections of the memory holes are slower to program due to the larger memory hole cross-sectional area and require a higher VPGMmax than the memory cells that are aligned with the bottom sections, which are faster to program and require a lower VPGMmax.

As discussed above and illustrated in FIG. 13, as the voltage being passed by a WLSW from the peripheral area to one of the word lines is increased, the voltage Vt that must be applied to the gate to turn on the WLSW increases. Additionally, as the WLSW is made narrower (less wide), the gate voltage required to turn on the WLSW also increases. However, the CMOS has a maximum voltage Vwlswmax that can be supplied to the gate. Accordingly, to turn on a WLSW so that it can conduct a very high VPGMmax voltage, the WLSW must be made wide enough to allow no more than the maximum voltage Vwlswmax of the CMOS to turn on the WLSW. In other words, the higher the VPGMmax voltage, the wider the WLSW must be made. Conversely, the WLSW can be less wide if the word line coupled to that WLSW has a lower VPGMmax voltage. In some embodiments, the gate voltage VPGMH to turn the WLSWs is constant for all WLSWs in the WLSW area.

The word lines of the memory block are divided up into zones based on which memory holes (the upper memory hole, the middle memory hole, and the lower memory hole) they are aligned with and where they are located within the respective memory holes, i.e., based on their programming speeds. In the example of FIGS. 14 and 15, the memory block includes two hundred and eighty word lines (W0-WL279) that are divided into nine zones (Zones 1-9). The nine exemplary zones include a first zone includes WL0-WL14 (aligned with a bottom section of the lower memory hole), a second zone includes WL15-41 (aligned with a middle section of the lower memory hole), a third zone includes WL42-WL51 (aligned with a top section of the lower memory hole), a fourth zone includes WL52-59 (aligned with a bottom section of the middle memory hole), a fifth zone includes WL60-WL80 (aligned with a middle section of the middle memory hole), a sixth zone includes WL81-WL169 (aligned with a top section of the middle memory hole), a seventh zone includes WL170-WL177 (aligned with a bottom section of the upper memory hole), an eighth zone includes WL178-WL199 (aligned with a middle section of the upper memory hole), and a ninth zone WL200-WL279 (aligned with a top section of the upper memory hole). In other embodiments, the word lines could be grouped into more or fewer than nine zones with the word lines of each zone having similar programming speeds. As illustrated in this table, each zone is associated with a unique VPGMmax voltage based on the expected programming speeds. In this example, V1 is the highest VPGMmax voltage that is only applied to the zones with the slowest to program word lines (Zones 6 and 9); V2 is less than V1 and is applied to Zones 2, 5, and 8; V3 is less than V2 and is applied to Zone 3; and V4 is less than V3 and is applied to Zones 1 and 4. V4 is the lowest VPGMmax voltage and is only applied to the zones with the fastest to program word lines. In some embodiments, there could be more or fewer than four unique VPGMmax voltages and they could be applied to the various zones in a different manner than this example.

Figure 16:
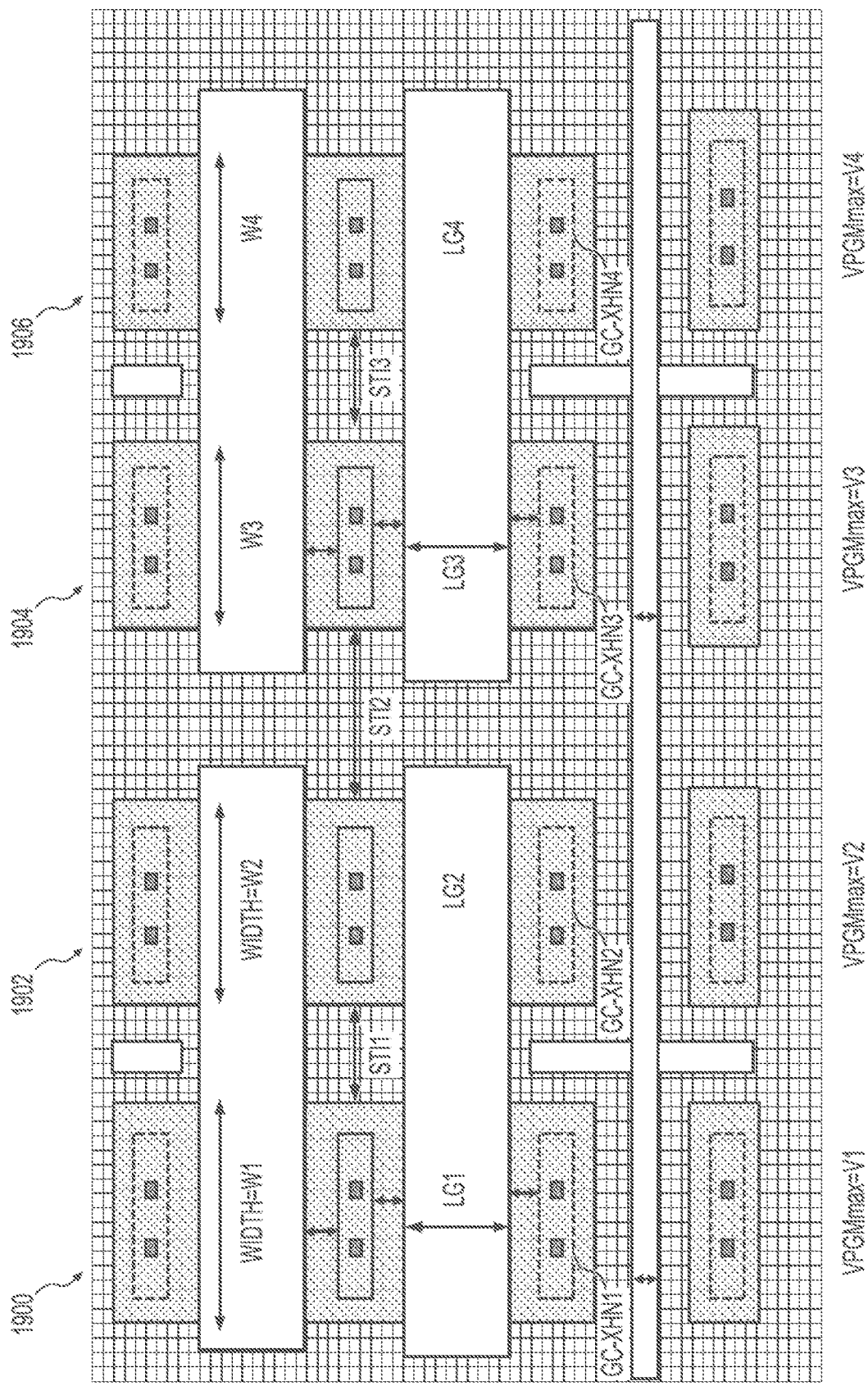
FIG. 16 is a schematic view of a plurality of word line switches constructed according to one example embodiment of the present disclosure.

Turning now to FIG. 16, a plurality of WLSWs having different widths are illustrated. In this example, WLSW 1900 has a width W1, WLSW 1902 has a width W2, WLSW 1904 has a width W3, and WLSW 1906 has a width W4. These widths have a relationship such that W1>W2>W3>W4. Although only four are illustrated in this Figure, it should be appreciated that the WLSW area includes one WLSW for each word line in a memory block, e.g., 280 WLSWs for 280 word lines. The widths W of the specific WLSWs depend on which zone the associated word line is located in. For example, with reference to the table of FIG. 15, a WLSW that is electrically coupled with a word line in Zone 9 will have a width W1 to accommodate the large V1 VPGMmax voltage; a WLSW that is electrically coupled with a word line in Zone 3 will have a width W2 to accommodate the V2 VPGMmax voltage; a WLSW that is electrically coupled with a word line in Zone 8 will have a width W3 to accommodate the V3 VPGMmax voltage; and a WLSW that is electrically coupled with a word line in Zone 1 will have a width W4 to accommodate the V4 VPGMmax voltage.

As also illustrated in FIG. 16, in some embodiments, the spacing STI between adjacent WLSWs is variable to further reduce the width of the WLSW area by allowing some of the WLSWs to be more densely packed within the WLSW area. During a programming operation, a programming pulse VPGM is applied to a selected word line and a pass voltage VPASS is applied to the other word lines in a memory block. In an example, the WLSW 1902 is passing the VPGM voltage to the selected word line and the other WLSWs 1900, 1904, 1906 are passing the lesser VPASS voltage to their respective word lines. The spacing STI is determined a function of the difference between VPGMmax and VPASS (VPGMmax—VPASS). More specifically, the spacing STI between adjacent WLSWs across the WLSW area is variable with the gap STI decreasing with decreasing VPGMmax voltages for the word lines that are coupled with the neighboring WLSWs. In other words, two WLSWs that are electrically coupled with word lines that have high VPGMmax voltages are separated from one another by a greater STI than two WLSWs that are electrically coupled with word line that have low VPGMmax voltages. In this example, the gap STI1 is greater than the gap STI2, which is greater than the gap STI3. By using variable spacing between the WLSWs, as opposed to using the same maximum spacing between all WLSWs, the total area of the WLSW area is further reduced to further optimize chip design.

As further illustrated in FIG. 16, the length LG of the gates, which dictates the spacing between the sources and the drains of the WLSWs, may also be determined as a function of the VPGMmax of the word lines coupled to the WLSWs. For example, a gate that is coupled to a WLSW that is coupled with a memory cell that has a high VPGMmax has a length LG that is greater than a gate that is coupled to a WLSW which is coupled with a memory cell that has a low VPGMmax. In the exemplary embodiment, each gate extends through and is connected with two WLSWs. While the WLSWs coupled to the single gate can have different widths W, each gate can only have a single length LG. Thus, the length LG of a gate must be set as a function of the greater VPGMmax of the two word lines coupled to the two WLSWs that share the same gate. By varying the lengths LG of the WLSWs, the WLSW area can be further optimized.

Still further, the space between gate edge and source contact, which is the lightly doped drain region (LDD), may be determined as a function of VPGMmax. Specifically, the length of the LDD areas of a WLSW can be dimensioned based on the VPGMmax voltages of the memory cells attached thereto with a larger VPGMmax voltage being associated with a larger LDD area and vice versa.

In some embodiments, a programming technique is provided to improve programming in memory chips where the WLSWs in a WLSW area have variable widths.

Specifically, as discussed in further detail below, these techniques involve the use of word line specific VwlswovWLSW overdrive voltages (Vwlswov) to ensure that the gate voltage VPGMH is both high enough to turn on a selected WLSW during programming but lower than a maximum allowable voltage Vwlswmax.

During programming, a VPGMH voltage is applied to the gate of a selected WLSW, which is coupled to a selected word line being programmed, to allow the selected WLSW to pass the programming voltage VPGM to the selected word line. The VPGMH voltage is set at a level that is equal to VPGM plus a bias Vwlswov. According to some programming techniques, Vwlswov is set as a function of the threshold voltage Vt of the WLSW (Vt_WLSW) and an overdrive voltage (Vov), i.e., Vwlswov=Vt_WLSW+Vov. Accordingly, VPGMH=VPGM+Vt_WLSW+Vov. However, as discussed above, reducing the width of a WLSW increases its threshold voltage Vt_WLSW. If the same Vwlswov is applied to all WLSWs, then in some cases a narrow WLSW could result in VPGMH exceeding the maximum chip voltage.

In an example embodiment, VPGMHI is maintained below the maximum allowable voltage Vwlswmax but high enough to turn on all WLSWs by making the bias Vwlswov word line dependent, i.e., different Vwlswovs for different word lines. For each WLSW, Vwlswov is set as a function of the width W of the WLSW. Since the width W is set as a function of VPGMmax, Vwlswov is also determined as a function of VPGMmax, which is based on the location of a word line within its memory block, i.e., which zone the word line is located in. More specifically, Vwlswov and width W are inversely related, i.e., Vwlswov decreases with increasing width W and vice versa. In the example table of FIG. 18, the WLSWs that are electrically coupled with the word lines in Zones 1, 4, and 7 are associated with Vwlswov_1; the WLSWs that are electrically coupled with the word lines in Zones 2, 5, and 8 are associated with Vwlswov_2; the WLSWs that are coupled with the word lines in Zone 3 are associated with Vwlswov_3; and the WLSWs that are electrically coupled with the word lines in Zones 6 and 9 are associated with Vwlswov_4. These bias voltages are set at levels such that Vwlswov_4>Vwlswov_3>Vwlswov_2>Vwlswov_1.

Figure 17:
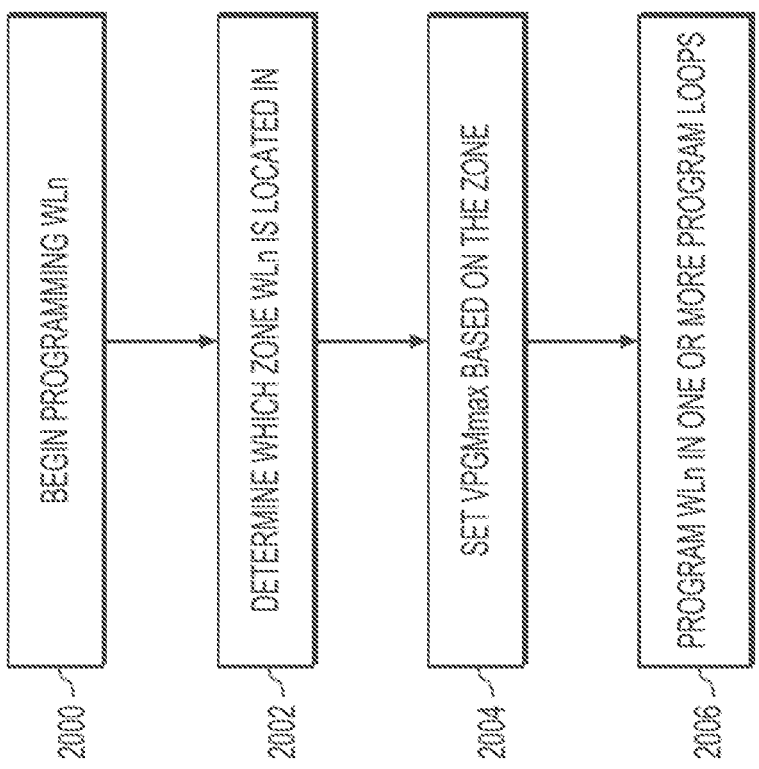
FIG. 17 is a flow chart illustrating the steps of programming a selected word line according to one example embodiment.

Turning now to FIG. 17, a flow chart is provided that depicts the steps of programming a selected word line WLn. These steps could be performed by the controller, a processor, a processing device, or any other circuitry that can execute instructions stored in memory.

At step 2000, programming of the selected word line WLn begins. At step 2002, it is determined which of a plurality of zones within the memory block the selected word line WLn is located in. At step 2004, the maximum programming voltage VPGMmax is set based on which zone the selected word line WLn is located in. At step 2006, the memory cells of the selected word line WLn are programmed to respective intended data states in a plurality of program loops. Each program loop includes a programming pulse at a programming voltage VPGM and a verify pulse. The programming voltage VPGM increases by a fixed step size dVPGM between program loops. Programming proceeds until either all of the memory cells of the selected word line WLn pass verify or until the programming voltage exceeds VPGMmax, at which point programming fails.

Figure 18:
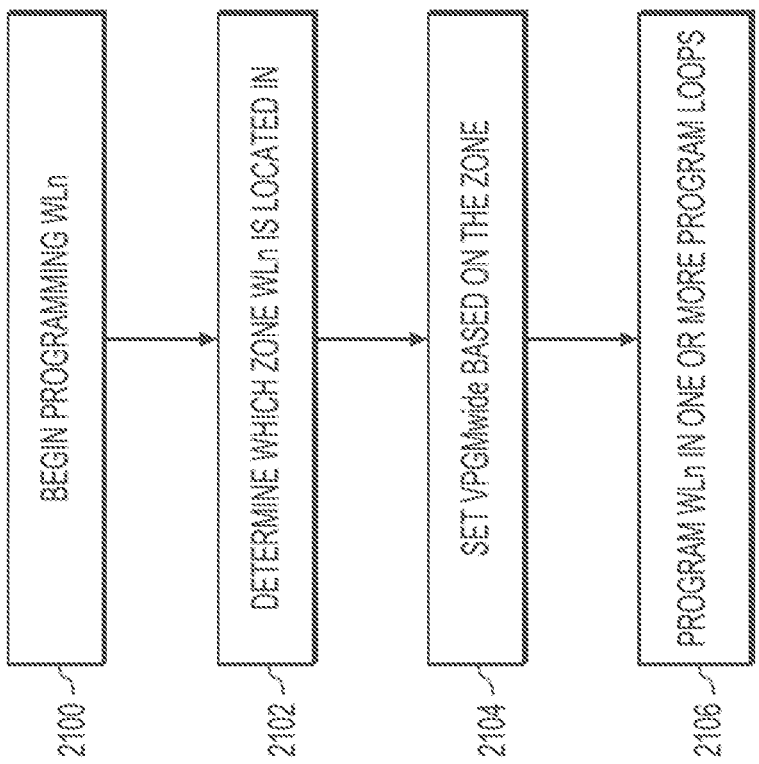
FIG. 18 is a flow chart illustrating the steps of programming a selected word line according to another example embodiment.

Turning now to FIG. 18, a flow chart is provided that depicts the steps of programming a selected word line WLn. These steps could be performed by the controller, a processor, a processing device, or any other circuitry that can execute instructions stored in memory.

At step 2100, programming of the selected word line WLn begins. At step 2102, it is determined which of a plurality of zones within the memory block the selected word line WLn is located in. At step 2104, a bias voltage Vwlswov, which is a factor in the gate voltage VPGMH applied to the WLSW that is electrically coupled with the selected word line WLn, is set based on which zone the selected word line WLn is located in. At step 2106, the memory cells of the selected word line WLn are programmed to respective intended data states in a plurality of program loops. Each program loop includes a programming pulse at a programming voltage VPGM and a verify pulse. The programming voltage VPGM increases by a fixed step size dVPGM between program loops. Programming proceeds until either all of the memory cells of the selected word line WLn pass verify or until the programming voltage exceeds VPGMmax, at which point programming fails.

Increasing word line count has been the method implemented for bit growth and cost reduction for each generation of a memory device. One challenge with increasing word line counts is that the proportionally increasing number of word line switches (WLSWs) in the planar CMOS wafer. For example, the number of word lines in an array rapidly increases in the z direction generation after generation, leading to higher and higher bit density for a fixed area.

Accordingly, the number of WLSW increases. Since WLSW in the planar CMOS wafer cannot be placed along a z direction as the word lines in the array wafer, the increasing number of WLSW occupies more and more space (specifically, width) of the CMOS wafer. This leads to a situation that the CMOS area becomes larger than the array area. At some point in the future, the cost benefit of increasing word line count will be diminished.

To address this issue, scaling down WLSW accordingly in each generation is the most natural consideration. However, the key factor that prevents the WLSW scaling is the need for a large maximum allowable program voltage (e.g., VPGM MAX) to achieve sufficient Vth window for MLC. To pass the large VPGM MAX, a large WLSW is needed to tolerate the high stress. Unfortunately, unless the memory hole (MH) size can be further scaled, VPGM MAX cannot be scaled from a Vth window perspective.

The WLSW for those word lines with small memory hole critical dimension (CD) (e.g., in the lower portion of each tier) may be scalable because the starting program voltage (e.g., VPGMU) for these WLSW is lower and they never really hit the VPGM MAX. In other words, WLSWs of some lower word lines can be scaled to some extent. However, other WLSWs remain difficult to scale.

To address the issues described, embodiments described herein are directed to reducing VPGM MAX and WLSW (thus chip size) by employing a word line dependent negative bitline (NBL) voltage. More specifically, embodiments described herein enable scaling of WLSWs with word line dependent negative bitline voltage.

Figure 19:
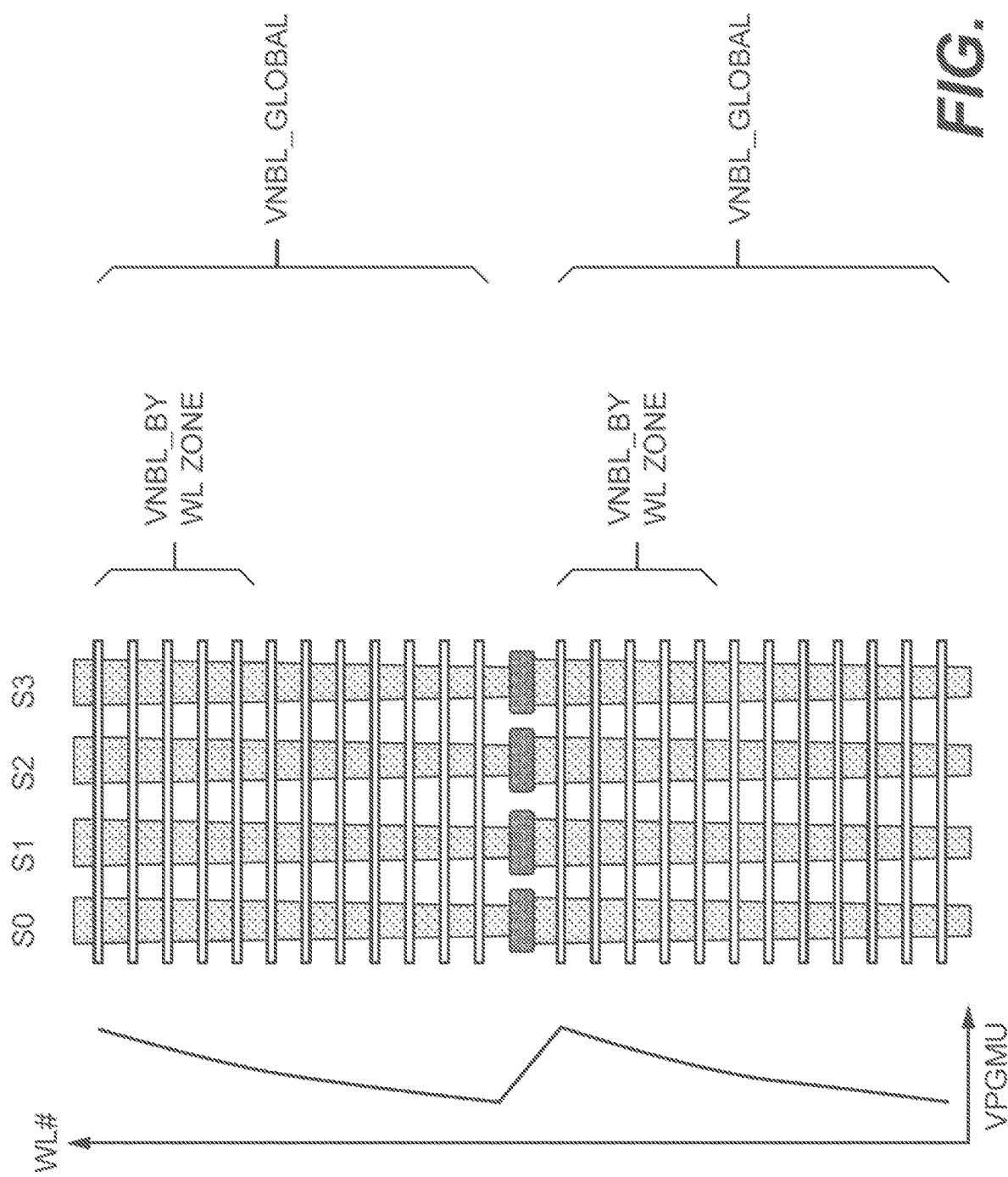
FIG. 19 is a schematic view of a two-tiered memory hole according to another example embodiment.

To explore this in further detail, FIG. 19 will now be described. FIG. 19 is a schematic view of a two-tiered memory hole. For example, in a two-tiered structure, each memory string has an upper memory hole and a lower memory hole. As depicted in FIG. 19, VPGMU is generally higher on higher word lines of each tier due to the larger memory hole CD. In some embodiments, a global negative bitline voltage may be applied for all word lines. For example, as depicted in FIG. 19, a parameter (e.g., VNBL_global) may be used to control a global negative bitline voltage. However, because word lines have different VPGM requirements, higher word lines require more negative bitline voltages to make VPGM uniform across all word lines. As such, a parameter, (e.g., VNBL_byWL) may be used to control negative bitline voltages by word line. For example, as depicted in FIG. 19, VNBL_byWL may be applied for higher word lines of the upper and lower tiers.

As described, prior WLSW scaling methods involve only WLSWs for small-VPGMU word lines being scaled. In embodiments described herein, WLSWs for large-VPGMU word lines may also be scaled when VNBL_byWL is applied during programming. Further, additional WLSW scaling may be achieved by applying VNBL_global (e.g., ~-3V).

Figure 20:
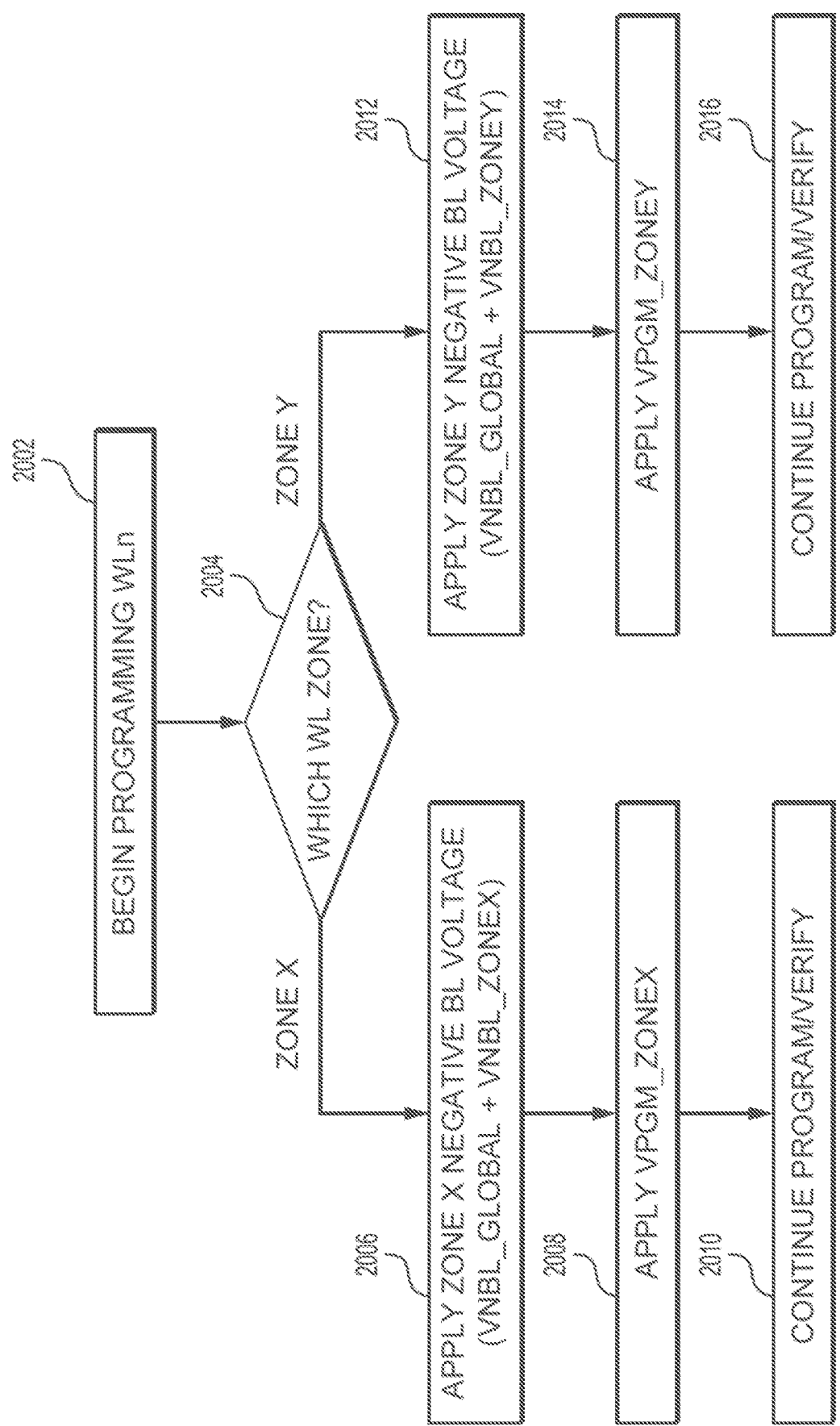
FIG. 20 a flow chart is provided that depicts the steps of programming a selected word line WLn by word line negative bitline implementation according to another example embodiment.

Turning now to FIG. 20, a flow chart is provided that depicts the steps of programming a selected word line WLn by word line negative bitline implementation, according to another embodiment of the present disclosure. These steps could be performed by the controller, a processor, a processing device, or any other circuitry that can execute instructions stored in memory.

At step 2002, programming of the selected word line WLn begins. At step 2004, it is determined which of a plurality of zones within the memory block the selected word line, WLn, is located in. If WLn is in zone X, at step 2006, zone X negative bitline voltage is applied (e.g., VNBL_global+ VNBL_zonex), and at step 2008, VPGM for zone X is applied. Thereafter, at step 2010, program/verify operation continues. Alternatively, if WLn is in zone Y, at step 2012, zone Y negative bitline voltage is applied (e.g., VNBL_global+VNBL_zoney), and at step 2014, VPGM for zone Y is applied. Thereafter, at step 2016, program/verify operation continues.

One programming technique, known as Quick Pass Write (QPW), slows programming of the memory cells that have passed a verify low VL voltage but have not passed a verify high VH voltage for a given data state (i.e., memory cells which are nearly finished with programming). To slow programming, during the application of a VPGM pulse to the control gate of a selected word line, a QPW voltage is applied to the bit lines coupled to the memory cells that have passed a verify low VL voltage associated with a programmed data state but have not passed the verify high VH voltage associated with that programmed data state. The QPW voltage increases the voltage in the channels containing the memory cells for which slow programming is desired, thereby reducing the voltage difference between the VPGM pulse and the channels and slowing the flow of electrons into the charge trapping materials of certain ones of the memory cells being programmed. Any memory cell with a threshold voltage Vth which passes the verify high VH voltage of its intended data state is then locked down, or inhibited, from further programming by applying an inhibit voltage VDDSA to the bit lines coupled to those memory cells during the application of subsequent VPGM pulses to the selected word line.

Figure 21:
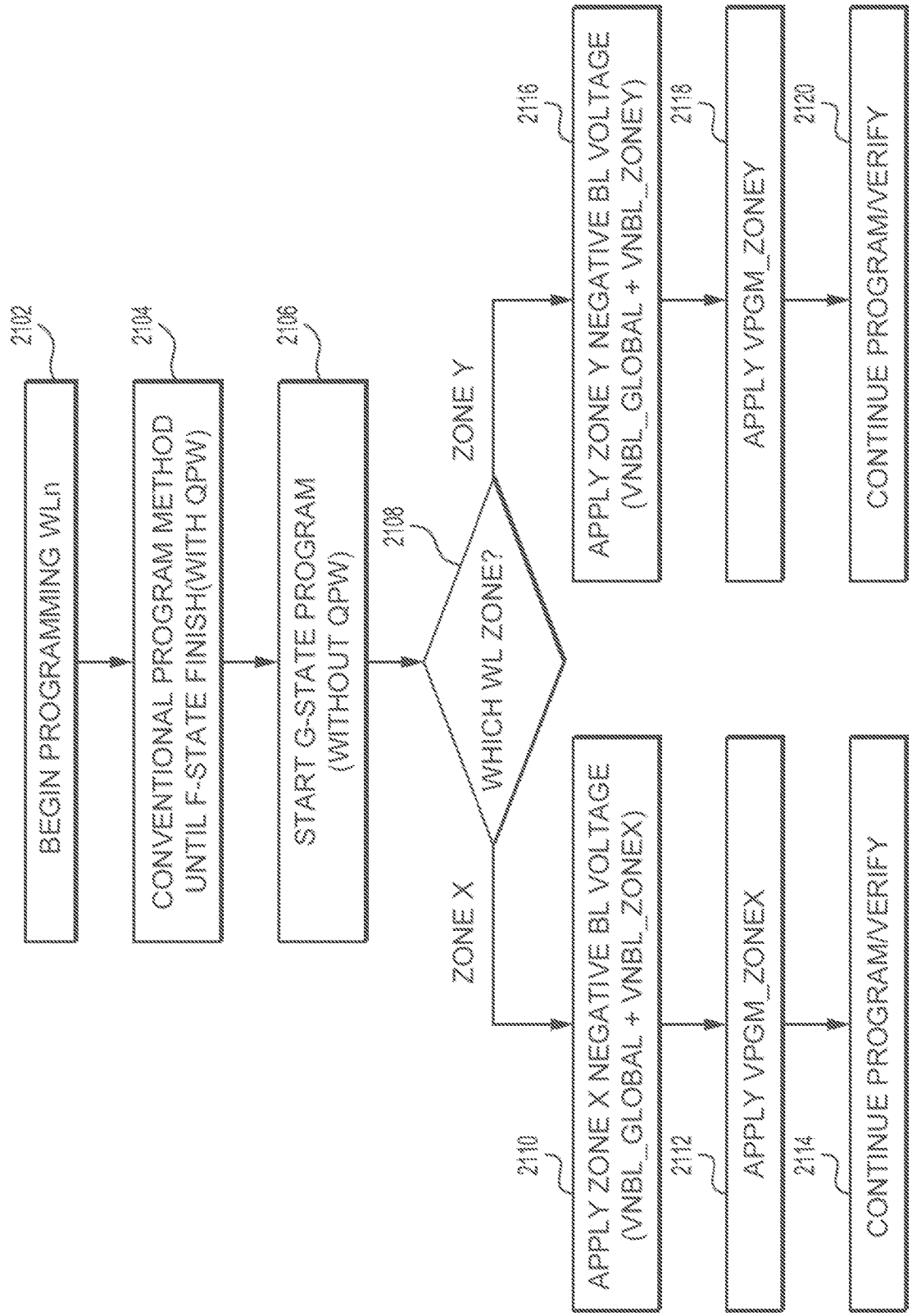
FIG. 21 depicts a flow chart of a conventional program method with QPW until programming of a final program state without QPW according to another embodiment of the present disclosure.

When implementing QPW, embodiments described herein are implemented only during a program loop for programming a highest data state which is performed without QPW and where VPGM MAX is most crucial. FIG. 21 depicts a flow chart of a conventional program method with QPW (e.g., until F-state has finished programming) until programming of a final program state (e.g., G state) without QPW, according to another embodiment of the present disclosure. These steps could be performed by the controller, a processor, a processing device, or any other circuitry that can execute instructions stored in memory.

At step 2102, programming of the selected word line WLn begins. At step 2104, conventional programming is performed with QPW until F-state finishes, and at step 2106, G-state programming without QPW starts.

Further, at step 2108, it is determined which of a plurality of zones within the memory block the selected word line WLn is located in. If WLn is in zone X, at step 2110, zone X negative bitline voltage is applied (e.g., VNBL_global+ VNBL_zonex), and at step 2112, VPGM for zone X is applied. Thereafter, at step 2114, program/verify operation continues. Alternatively, If WLn is in zone Y, at step 2116, zone Y negative bitline voltage is applied (e.g., VNBL_global+VNBL_zoney), and at step 2118, VPGM for zone y is applied. Thereafter, at step 2120, program/verify operation continues. In some embodiments, VNBL_byWL is also applied to the select gate line SGD and/or the select gate line SGS.

Turning now to FIG. 22, a flow chart is provided that depicts the steps of programming a selected word line WLn according to one embodiment of the present disclosure. These steps could be performed by the controller, a processor, a processing device, or any other circuitry that can execute instructions stored in memory.

At step 2202, a selected word line of a plurality of word lines is programmed to respective intended data states in a plurality of program loops. At step 2204, a bitline corresponding to a memory cell of the selected word line is biased during programming of the selected word line, which comprises providing a negative biasing voltage to the bitline and setting a magnitude of the negative biasing voltage based on a zone of a plurality of zones the selected word line is in. The plurality of word lines are grouped into the plurality of zones based on a size of a word line switch transistor associated with each word line of the plurality of word lines.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or mores," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A memory device, comprising:
   a memory block that includes a plurality of memory cells that are arranged in a plurality of word lines;
   a plurality of word line switch transistors that are electrically coupled with the plurality of word lines, wherein the plurality of word lines are grouped into a plurality of zones based on a size of a word line switch transistor associated with each word line of the plurality of word lines;
   programming circuitry being configured to program a selected word line of the plurality of word lines to respective intended data states in a plurality of program loops; and
   a bitline biasing circuit for biasing a bitline corresponding to a memory cell of the selected word line during programming of the selected word line, the bitline biasing circuit operating to provide a negative biasing voltage to the bitline, wherein the bitline biasing circuit is configured to set a magnitude of the negative biasing voltage based on which zone of the plurality of zones the selected word line is in.

2. The memory device as set forth in claim 1, wherein the bitline biasing circuit is further configured to provide a same negative biasing voltage for any zone of the plurality of zones.

3. The memory device as set forth in claim 1, wherein word line switch transistors of at least one zone of the plurality of zones have different widths than word line switch transistors of at least one other zone of the plurality of zones.

4. The memory device as set forth in claim 1, wherein the bitline biasing circuit is further configured to provide the negative biasing voltage only during a program loop of the plurality of loops for programming a highest data state.

5. The memory device as set forth in claim 1, wherein some word line switch transistors have a first width and some other word line switch transistors have a second width that is different than the first width.

6. The memory device as set forth in claim 1, wherein the magnitude of the negative biasing voltage is higher for a zone of the plurality of zones associated with a top section of a memory hole than other zones of the plurality of zones associated with other sections of the memory hole.

7. The memory device as set forth in claim 1, wherein the magnitude of the negative biasing voltage is lower for a zone of the plurality of zones associated with a bottom section of a memory hole than other zones of the plurality of zones associated with other sections of the memory hole.

8. A method of operating a memory device, comprising the steps of:
   programming a selected word line of a plurality of word lines to respective intended data states in a plurality of program loops; and
   biasing a bitline corresponding to a memory cell of the selected word line during programming of the selected word line comprising providing a negative biasing voltage to the bitline and setting a magnitude of the negative biasing voltage based on a zone of a plurality of zones the selected word line is in, wherein the plurality of word lines are grouped into the plurality of zones based on a size of a word line switch transistor associated with each word line of the plurality of word lines.

9. The method as set forth in claim 8, further compromising:
   providing a same negative biasing voltage for any zone of the plurality of zones.

10. The method as set forth in claim 8, wherein word line switch transistors of at least one zone of the plurality of zones have different widths than word line switch transistors of at least one other zone of the plurality of zones.

11. The method as set forth in claim 8, further comprising:
   providing the negative biasing voltage only during a program loop of the plurality of loops for programming a highest data state.

12. The method as set forth in claim 8, wherein a plurality of word line switch transistors are electrically coupled with the plurality of word lines and some word line switch transistors have a first width and some other word line switch transistors have a second width that is different than the first width.

13. The method as set forth in claim 8, wherein the magnitude of the negative biasing voltage is higher for a zone of the plurality of zones associated with a top section of a memory hole than other zones of the plurality of zones associated with other sections of the memory hole.

14. The method as set forth in claim 8, wherein the magnitude of the negative biasing voltage is lower for a zone of the plurality of zones associated with a bottom section of a memory hole than other zones of the plurality of zones associated with other sections of the memory hole.

15. An apparatus, comprising:
a means for programming a selected word line of a plurality of word lines to respective intended data states in a plurality of program loops;
a means for providing a negative biasing voltage to a bitline corresponding to a memory cell of the selected word line during programming of the selected word line; and
a means for setting a magnitude of the negative biasing voltage based on a zone of a plurality of zones the selected word line is in, wherein the plurality of word lines are grouped into the plurality of zones based on a size of a word line switch transistor associated with each word line of the plurality of word lines.

16. The apparatus as set forth in claim 15, further comprising:
a means for providing a same negative biasing voltage for any zone of the plurality of zones.

17. The apparatus as set forth in claim 15, further comprising:
a means for providing the negative biasing voltage only during a program loop of the plurality of loops for programming a highest data state.

18. The apparatus as set forth in claim 15, wherein a plurality of word line switch transistors are electrically coupled with the plurality of word lines and some word line switch transistors have a first width and some other word line switch transistors have a second width that is different than the first width.

19. The apparatus as set forth in claim 15, wherein the magnitude of the negative biasing voltage is higher for a zone of the plurality of zones associated with a top section of a memory hole than other zones of the plurality of zones associated with other sections of the memory hole.

20. The apparatus as set forth in claim 15, wherein the magnitude of the negative biasing voltage is lower for a zone of the plurality of zones associated with a bottom section of a memory hole than other zones of the plurality of zones associated with other sections of the memory hole.

* * * * *